(12) United States Patent  
Sato et al.

(10) Patent No.: US 12,142,310 B2  
(45) Date of Patent: *Nov. 12, 2024

(54) METHOD OF FABRICATING PEDESTAL BASED MEMORY DEVICES USING POCKET INTEGRATION

(71) Applicant: Kepler Computing, Inc., San Francisco, CA (US)

(72) Inventors: Noriyuki Sato, Hillsboro, OR (US); Tanay Gosavi, Portland, OR (US); Niloy Mukherjee, San Ramon, CA (US); Amrita Mathuriya, Portland, OR (US); Rajeev Kumar Dokania, Beaverton, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 433 days.

This patent is subject to a terminal disclaimer.

(21) Appl. No.: 17/485,161

(22) Filed: Sep. 24, 2021

(65) Prior Publication Data

US 2023/0070073 A1    Mar. 9, 2023

Related U.S. Application Data

(63) Continuation of application No. 17/465,796, filed on Sep. 2, 2021, now Pat. No. 11,942,133.

(51) Int. Cl.
*H01L 23/522* (2006.01)
*G11C 11/22* (2006.01)
(Continued)

(52) U.S. Cl.
CPC ...... *G11C 11/221* (2013.01); *H01L 21/76802* (2013.01); *H01L 21/76805* (2013.01);
(Continued)

(58) Field of Classification Search
CPC .................. H10B 53/20; H10B 53/30
See application file for complete search history.

(56) References Cited

U.S. PATENT DOCUMENTS 5,705,414 A * 1/1998 Lustig ............... H01L 21/28132
438/585
5,739,563 A 4/1998 Kawakubo et al.
(Continued)

FOREIGN PATENT DOCUMENTS

DE    102015015854 A1    6/2017
JP    2006352005 A    12/2006
(Continued)

OTHER PUBLICATIONS

Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
(Continued)

*Primary Examiner* — Kevin Parendo
(74) *Attorney, Agent, or Firm* — MUGHAL GAUDRY & FRANKLIN PC

(57) ABSTRACT

A pocket integration for high density memory and logic applications and methods of fabrication are described. While various examples are described with reference to FeRAM, capacitive structures formed herein can be used for any application where a capacitor is desired. For instance, the capacitive structure can be used for fabricating ferroelectric based or paraelectric based majority gate, minority gate, and/or threshold gate.

17 Claims, 23 Drawing Sheets

(51) Int. Cl.
| | | |
|---|---|---|
| *H01L 21/768* | (2006.01) | |
| *H01L 23/532* | (2006.01) | |
| *H01L 23/535* | (2006.01) | |
| *H01L 23/538* | (2006.01) | |
| *H01L 49/02* | (2006.01) | |
| *H03K 19/185* | (2006.01) | |
| *H10B 53/20* | (2023.01) | |
| *H10B 53/30* | (2023.01) | |

(52) U.S. Cl.
CPC .. *H01L 21/76831* (2013.01); *H01L 21/76895* (2013.01); *H01L 23/5226* (2013.01); *H01L 23/53209* (2013.01); *H01L 23/53228* (2013.01); *H01L 23/53242* (2013.01); *H01L 23/53257* (2013.01); *H01L 23/535* (2013.01); *H01L 23/5381* (2013.01); *H01L 23/5386* (2013.01); *H01L 28/55* (2013.01); *H01L 28/60* (2013.01); *H01L 28/65* (2013.01); *H03K 19/185* (2013.01); *H10B 53/20* (2023.02); *H10B 53/30* (2023.02)

(56) References Cited

U.S. PATENT DOCUMENTS

| | | | |
|---|---|---|---|
| 6,165,864 | A | 12/2000 | Shen et al. |
| 6,177,351 | B1 | 1/2001 | Beratan et al. |
| 6,211,035 | B1 | 4/2001 | Moise et al. |
| 6,365,927 | B1 | 4/2002 | Cuchiaro et al. |
| 6,368,910 | B1 | 4/2002 | Sheu et al. |
| 6,548,343 | B1 | 4/2003 | Summerfelt et al. |
| 6,613,586 | B2 | 9/2003 | Bailey |
| 6,699,725 | B2 | 3/2004 | Lee |
| 6,753,193 | B2 | 6/2004 | Kim |
| 7,075,134 | B2 | 7/2006 | Araujo et al. |
| 7,754,501 | B2 | 7/2010 | Urushido |
| 7,977,720 | B2 | 7/2011 | Fukada |
| 8,440,508 | B2 | 5/2013 | Udayakumar et al. |
| 8,916,872 | B1 | 12/2014 | Tran et al. |
| 9,847,338 | B2 | 12/2017 | Nakao |
| 9,875,784 | B1 | 1/2018 | Li et al. |
| 10,847,201 | B2 | 11/2020 | Manipatruni et al. |
| 11,043,472 | B1 | 6/2021 | Dokania et al. |
| 11,063,131 | B2 | 7/2021 | Haratipour et al. |
| 11,139,270 | B2 | 10/2021 | Manipatruni et al. |
| 11,164,976 | B2 | 11/2021 | Ramamoorthy et al. |
| 11,659,714 | B1 | 5/2023 | Mukherjee et al. |
| 2001/0013614 | A1 | 8/2001 | Joshi et al. |
| 2002/0045279 | A1 | 4/2002 | Kwon et al. |
| 2002/0098645 | A1 | 7/2002 | Jung et al. |
| 2003/0030084 | A1 | 2/2003 | Moise et al. |
| 2005/0020054 | A1 | 1/2005 | Hilliger et al. |
| 2006/0133129 | A1 | 6/2006 | Rodriguez et al. |
| 2007/0045690 | A1 | 3/2007 | Fukada |
| 2007/0232016 | A1* | 10/2007 | Hayashi ............. H10B 53/30 257/E21.664 |
| 2008/0057641 | A1 | 3/2008 | Wang |
| 2008/0121956 | A1* | 5/2008 | Kanaya ............... H01L 28/55 257/295 |
| 2008/0121959 | A1 | 5/2008 | Izumi |
| 2008/0197502 | A1 | 8/2008 | Kikuchi et al. |
| 2009/0026514 | A1 | 1/2009 | Wang |
| 2009/0032978 | A1* | 2/2009 | Bucchignano ........ G03F 9/7076 257/E23.179 |
| 2010/0102404 | A1 | 4/2010 | Li et al. |
| 2010/0224961 | A1 | 9/2010 | Summerfelt et al. |
| 2010/0320518 | A1 | 12/2010 | Ozaki |
| 2011/0062550 | A1 | 3/2011 | Udayakumar et al. |
| 2013/0149794 | A1 | 6/2013 | Wang |
| 2013/0264620 | A1 | 10/2013 | Yu et al. |
| 2020/0051833 | A1 | 2/2020 | Chen et al. |
| 2020/0235111 | A1 | 11/2020 | Calderoni et al. |
| 2020/0395460 | A1 | 12/2020 | Haratipour et al. |
| 2021/0082928 | A1* | 3/2021 | Chen ..................... H10B 53/30 |
| 2021/0202510 | A1 | 7/2021 | Thareja et al. |
| 2021/0202511 | A1 | 7/2021 | Yeong et al. |
| 2021/0202689 | A1 | 7/2021 | Thareja et al. |
| 2021/0233920 | A1 | 7/2021 | Sukekawa |
| 2021/0272896 | A1* | 9/2021 | Lin ................... H01L 21/76802 |
| 2021/0343731 | A1 | 11/2021 | Chen et al. |
| 2021/0398991 | A1 | 12/2021 | Manfrini et al. |
| 2021/0398992 | A1 | 12/2021 | Wu et al. |
| 2022/0199634 | A1 | 6/2022 | Calderoni et al. |
| 2022/0285376 | A1 | 9/2022 | Chen et al. |
| 2022/0344338 | A1 | 10/2022 | Yang et al. |
| 2022/0376075 | A1 | 11/2022 | Manfrini et al. |
| 2022/0399352 | A1 | 12/2022 | Leng |
| 2023/0067555 | A1 | 3/2023 | Sato et al. |
| 2023/0187476 | A1 | 6/2023 | Sato et al. |
| 2023/0189532 | A1 | 6/2023 | Müller |

FOREIGN PATENT DOCUMENTS

| | | |
|---|---|---|
| JP | 4428500 B2 | 3/2010 |
| KR | 100481867 B1 | 4/2005 |
| KR | 100601953 B1 | 7/2006 |
| KR | 100791074 B1 | 1/2008 |
| KR | 100901950 B1 | 6/2009 |
| WO | 2004076166 A2 | 9/2004 |

OTHER PUBLICATIONS

Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.

Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).

Walters, "Scaling and Design of Thin Film Ferroelectric Hafnium Oxide for Memory and Logic Devices," Dissertation for PhD Philosophy, University of Florida, 2020 (170 pages).

Yeh et al., "Fabrication and Investigation of Three-Dimensional Ferroelectric Capacitors for the Application of FeRAM," AIP Advances, 6 035128(2016); doi: 10.1063/1.4945405. 13 pages.

Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.

Desu et al., "Reactive ion etching of ferroelectric SrBi2TaxNb2-xO9 thin films," Appl. Phys. Lett. 68, 566 (1996); https://doi.org/10.1063/1.116402. (3 pages).

Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. pages 6749-6753. (5 pages).

News Release Jun. 22, 2021, "Perovskite memory devices with ultra-fast switching speed," Pohang University of Science & Technology (POSTECH), Downloaded on Oct. 19, 2021 from https://www.eurekalert.org/news-releases/603724. (2 pages).

Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).

Shi et al., "Reactive ion etching of sol-gel-derived BST thin film," Ceramics International vol. 30, Iss. 7, 2004, pp. 1513-1516. (4 pages).

Ueda et al., "Plasma etching of PZT capacitor using ISM plasma source for ferroelectric memory application," Integrated Ferroelectrics, 39:1-4, 23-30, DOI: 10.1080/10584580108011924. (8 pages).

Wang et al., "Ferroelectric Devices and Circuits for Neuro-Inspired Computing," MRS Communications (2020), 10, 538-548, doi: 10.1557/mrc.2020.71, (11 pages).

Restriction Requirement notified May 1, 2023 for U.S. Appl. No. 17/552,330.

(56) References Cited

OTHER PUBLICATIONS

Restriction Requirement notified May 1, 2023 for U.S. Appl. No. 17/552,345.
Restriction Requirement notified Sep. 14, 2023 for U.S. Appl. No. 17/465,796.
U.S. Appl. No. 17/396,609, filed Aug. 6, 2021, Debraj Guhabiswas, Entire Document.
U.S. Appl. No. 17/449,750, filed Oct. 1, 2021, Noriyuki Sato, Entire Document.
Final Office Action notified Apr. 6, 2023 for U.S. Appl. No. 17/396,609.
Final Office Action notified Jul. 19, 2023 for U.S. Appl. No. 17/478,849.
Final Office Action notified Sep. 14, 2023 for U.S. Appl. No. 17/465,792.
First Office Action mailed Nov. 3, 2023 for TW Patent Application No. 111132919 Office Action recalled for typographical errors.
First Office Action mailed Nov. 14, 2023 for TW Patent Application No. 111132919 Office Action issued on Nov. 3, 2023 recalled for typographical errors.
Non-Final Office Action notified Apr. 25, 2023 for U.S. Appl. No. 17/478,850.
Non-Final Office Action notified Aug. 3, 2023 for U.S. Appl. No. 17/552,293.
Non-Final Office Action notified Aug. 3, 2023 for U.S. Appl. No. 17/552,323.
Non-Final Office Action notified Aug. 3, 2023 for U.S. Appl. No. 17/552,345.
Non-Final Office Action notified Aug. 15, 2023 for U.S. Appl. No. 17/552,269.
Non-Final Office Action notified Dec. 8, 2022 for U.S. Appl. No. 17/396,609.
Non-Final Office Action notified Dec. 21, 2023 for U.S. Appl. No. 17/465,792.
Non-Final Office Action notified Jan. 18, 2024 for U.S. Appl. No. 17/502,942.
Non-Final Office Action notified Jan. 19, 2024 for U.S. Appl. No. 17/503,009.
Non-Final Office Action notified Jul. 20, 2023 for U.S. Appl. No. 17/50,899.
Non-Final Office Action notified Jul. 20, 2023 for U.S. Appl. No. 17/552,266.
Non-Final Office Action notified Jul. 20, 2023 for U.S. Appl. No. 17/552,330.
Non-Final Office Action notified Mar. 31, 2023 for U.S. Appl. No. 17/465,792.
Non-Final Office Action notified Mar. 31, 2023 for U.S. Appl. No. 17/478,849.
Notice of Allowance notified Aug. 7, 2023 for U.S. Appl. No. 17/,85850.
Notice of Allowance notified Aug. 7, 2023 for U.S. Appl. No. 17/553,486.
Notice of Allowance notified Aug. 7, 2023 for U.S. Appl. No. 17/553,496.
Notice of Allowance notified Aug. 10, 2023 for U.S. Appl. No. 17/553,475.
Notice of Allowance notified Aug. 11, 2023 for U.S. Appl. No. 17/478,849.
Notice of Allowance notified Dec. 7, 2023 for U.S. Appl. No. 17/552,330.
Notice of Allowance notified Dec. 13, 2023 for U.S. Appl. No. 17/552,321.
Notice of Allowance notified Dec. 28, 2023 for U.S. Appl. No. 17/552,269.
Notice of Allowance notified Dec. 28, 2023 for U.S. Appl. No. 17/552,293.
Notice of Allowance notified Feb. 16, 2024 for Taiwan Patent Application No. 111132919.
Notice of Allowance notified Jan. 18, 2024 for U.S. Appl. No. 17/552,323.
Notice of Allowance notified Jan. 24, 2024 for U.S. Appl. No. 17/552,345.
Notice of Allowance notified Jul. 3, 2023 for U.S. Appl. No. 17/550,904.
Notice of Allowance notified Jul. 17, 2023 for U.S. Appl. No. 17/553,480.
Notice of Allowance notified Jul. 19, 2023 for U.S. Appl. No. 17/553,508.
Notice of Allowance notified Jul. 20, 2023 for U.S. Appl. No. 17/553,469.
Notice of Allowance notified Jul. 24, 2023 for U.S. Appl. No. 17/553,472.
Notice of Allowance notified Jul. 26, 2023 for U.S. Appl. No. 17/553,511.
Notice of Allowance notified Jun. 15, 2023 for U.S. Appl. No. 17/396,609.
Notice of Allowance notified Nov. 13, 2023 for U.S. Appl. No. 17/465,796.
Notice of Allowance notified Nov. 22, 2023 for U.S. Appl. No. 17/550,899.
Notice of Allowance notified Nov. 29, 2023 for U.S. Appl. No. 17/552,266.
Office Action—Written Primary Examination Decision—notified Jan. 10, 2024 for Taiwan Patent Application No. 111132920.
Office Action notified May 16, 2023 for Taiwan Patent Application No. 111132920.
Restriction Requirement notified Apr. 26, 2023 for U.S. Appl. No. 17/550,899.
Restriction Requirement notified Apr. 26, 2023 for U.S. Appl. No. 17/552,266.
Restriction Requirement notified Apr. 26, 2023 for U.S. Appl. No. 17/552,321.
Restriction Requirement notified Aug. 22, 2022 for U.S. Appl. No. 17/396,609.
Restriction Requirement notified Dec. 30, 2022 for U.S. Appl. No. 17/465,92.
Restriction Requirement notified Jan. 11, 2023 for U.S. Appl. No. 17/478,849.
Restriction Requirement notified Jul. 13, 2023 for U.S. Appl. No. 17/552,269.
Notice of Allowance notified Apr. 3, 2024 for U.S. Appl. No. 17/465,792.
Notice of Allowance notified May 6, 2024 for U.S. Appl. No. 17/503,009.
Notice of Allowance notified May 8, 2024 for U.S. Appl. No. 17/502,942.
Restriction Requirement notified Apr. 18, 2024 for U.S. Appl. No. 18/450,499.
Restriction Requirement notified Jun. 4, 2024 for U.S. Appl. No. 17/485,147.
Restriction Requirement notified May 17, 2024 for U.S. Appl. No. 17/449,750.

* cited by examiner

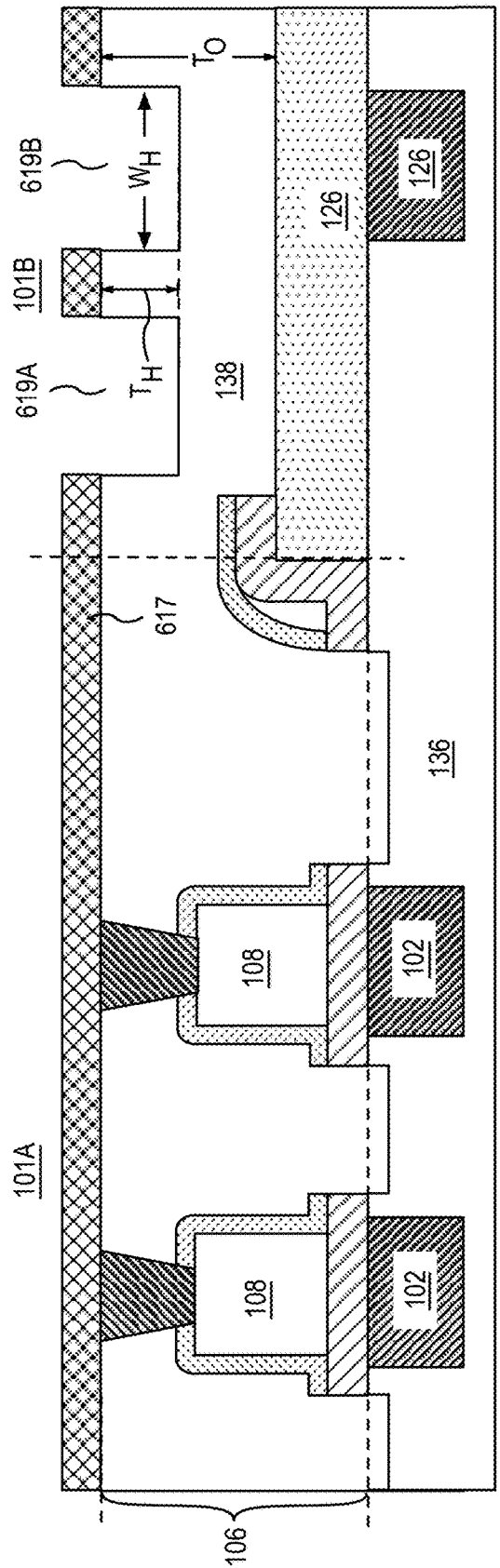
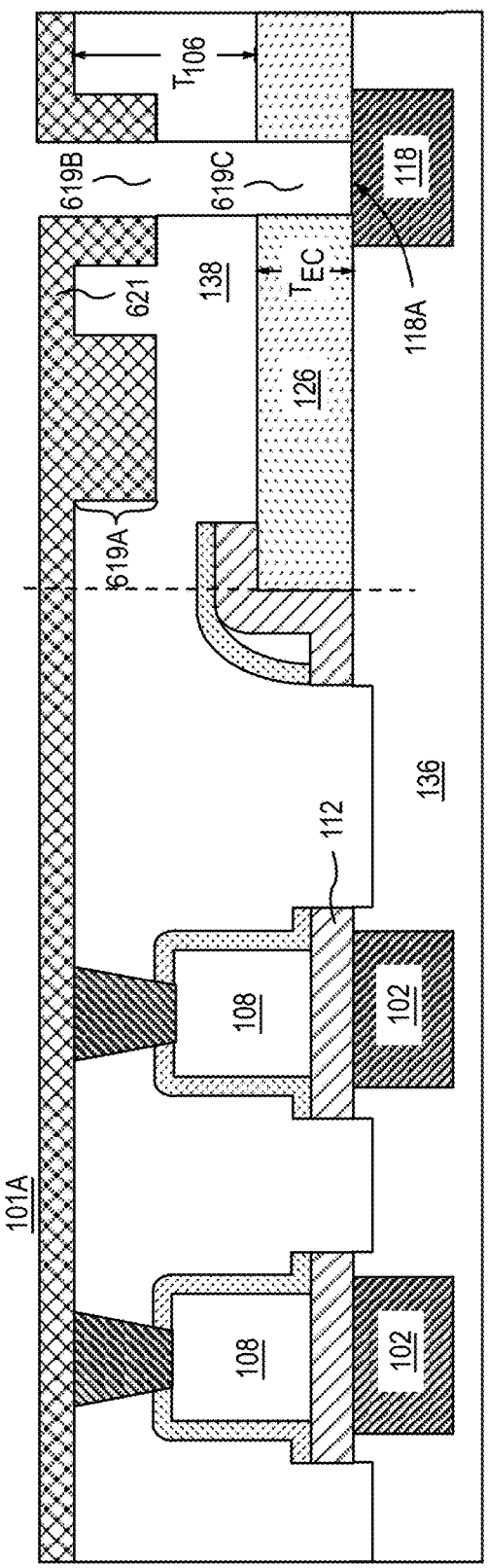
FIG. 8D
FIG. 8E

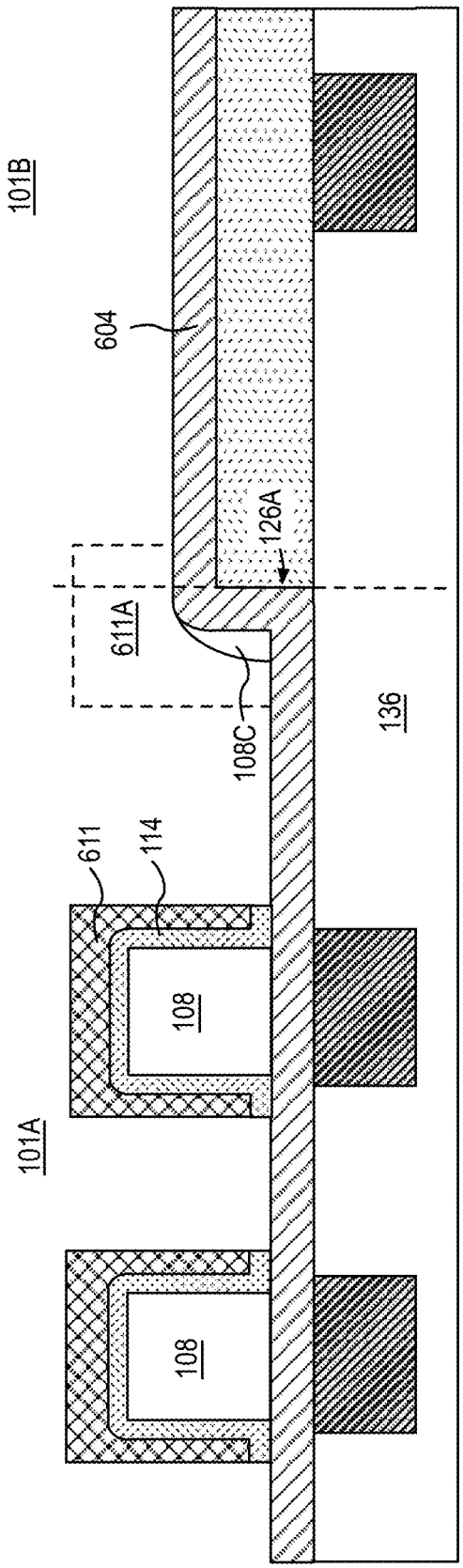
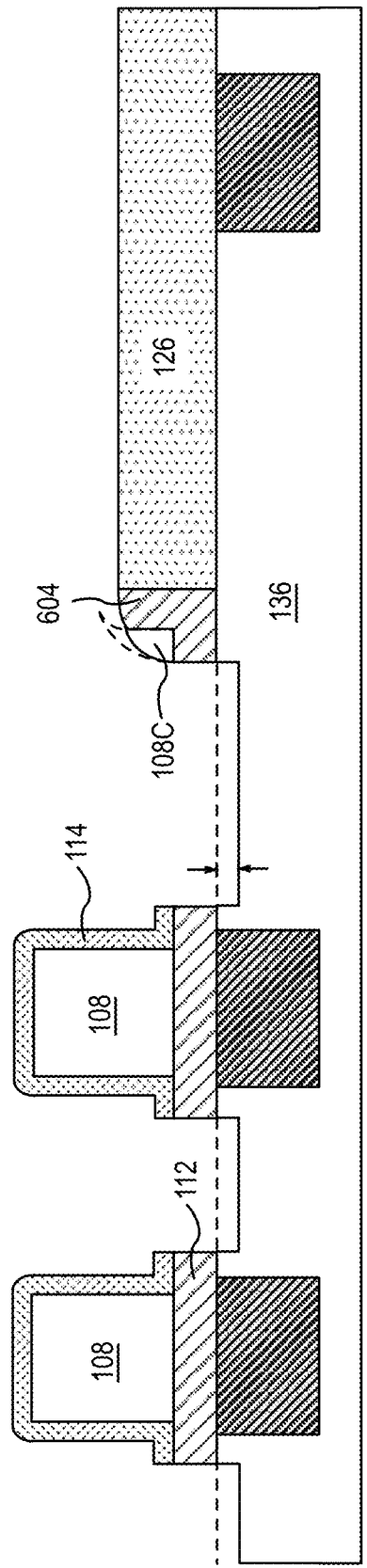
FIG. 9A
FIG. 9B

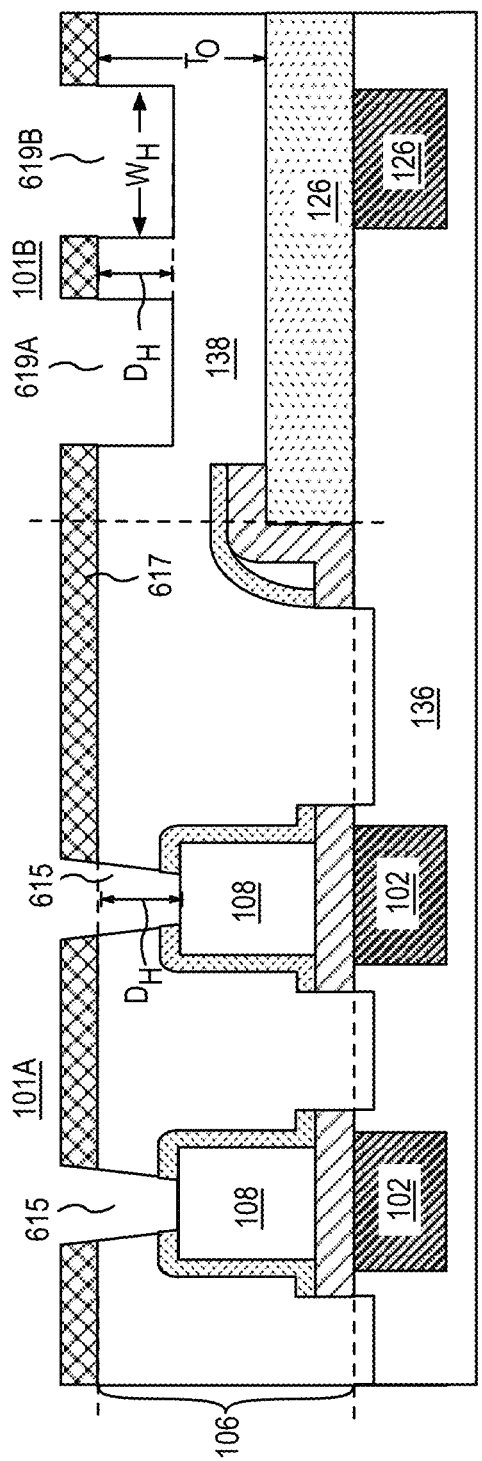
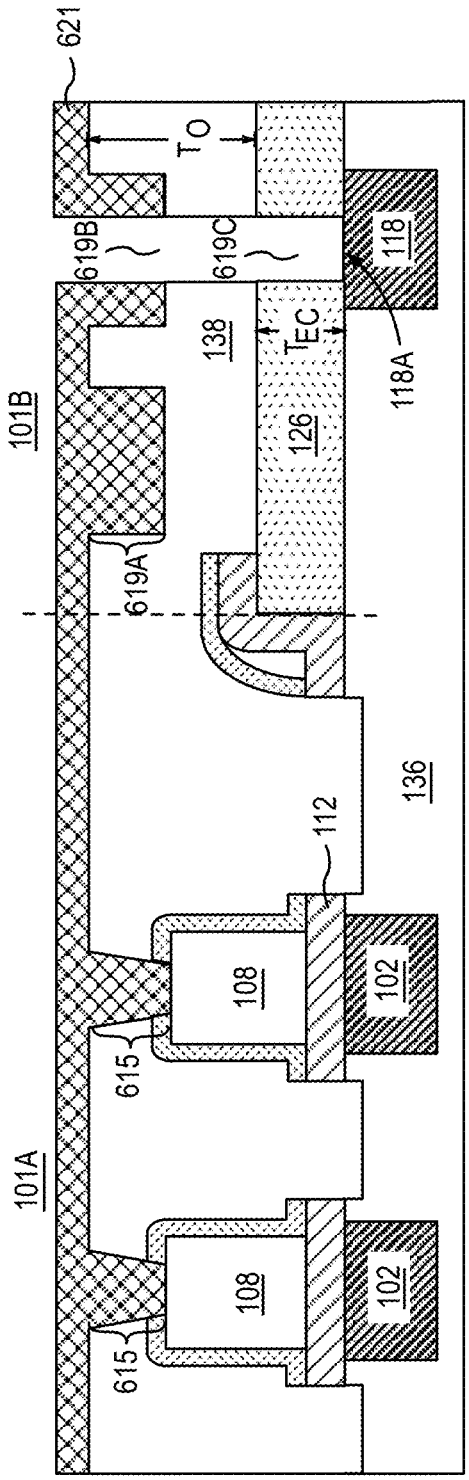
FIG. 16A
FIG. 16B

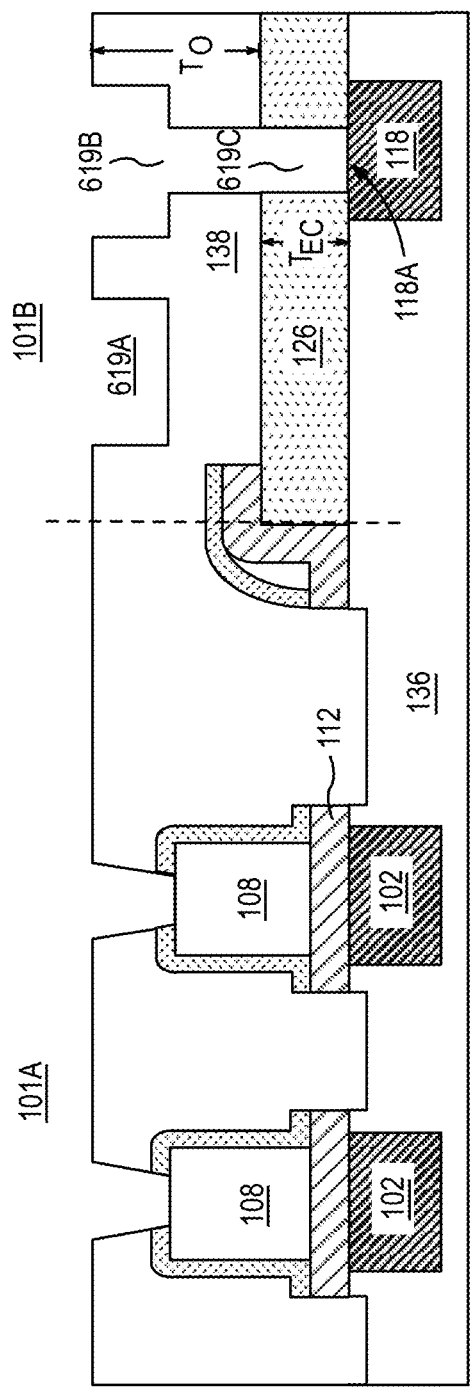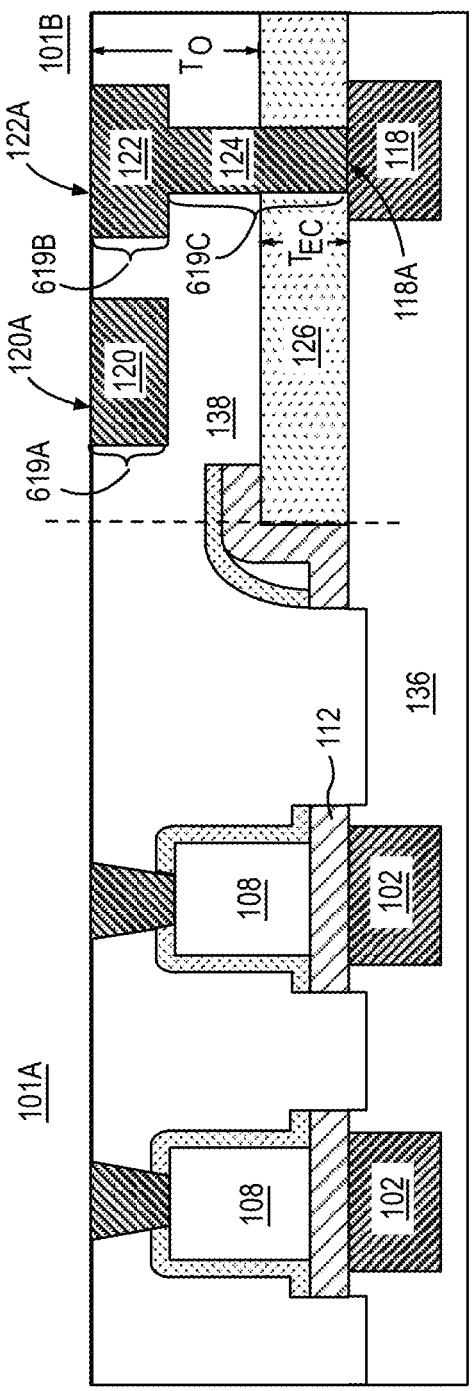

METHOD OF FABRICATING PEDESTAL BASED MEMORY DEVICES USING POCKET INTEGRATION

CLAIM FOR PRIORITY

This application is a Continuation of, and claims the benefit of priority to, U.S. patent application Ser. No. 17/465,796, filed Sep. 2, 2021, and now issued as U.S. Pat. No. 11,942,133 on Mar. 26, 2024, and which is incorporated by reference in its entirety for all purposes.

BACKGROUND

Integration of ferroelectric random-access memory (FeRAM) devices on a same plane as interconnects of logic devices can be challenging. FeRAM devices include materials that have a variety of thicknesses and be difficult to etch. Targeting a device thickness in a memory region with a height constraint of interconnects in an adjacent logic region is challenging. As such alternate methods to pattern and form devices that include ferroelectric materials is essential to realize a high-density array.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 8D is a cross-sectional illustration of the structure in FIG. 8C following the process to etch the second dielectric to form hanging trenches in the logic region 101B.

FIG. 8E is a cross-sectional illustration of the structure in FIG. 8D following the process to etch the second dielectric to form an opening within the hanging trench in the logic region.

FIG. 9A is a cross-sectional illustration of the structure in FIG. 6F, following a process to etch the encapsulation layer to remove or reduce a thickness of a residue portion.

FIG. 9B is a cross-sectional illustration of the structure in FIG. 9A following a process to etch and remove the electrode material to form ferroelectric memory devices.

FIG. 16A illustrates the structure of FIG. 8E following the process to form openings in a second dielectric formed above the ferroelectric memory devices and form trench openings in the logic region, in accordance with some embodiments.

FIG. 16B illustrates the structure of FIG. 16A following the process to form a mask on the second dielectric in the openings in the memory region, in the trench openings, where the mask forms a via opening in one of the trench openings.

FIG. 16C illustrates the structure of FIG. 16B following the process to remove the mask and expose a ferroelectric memory device in each opening in the memory region, and remove the mask in the logic region.

FIG. 16D illustrates the structure of FIG. 16C following the process to form via electrodes in the openings in the memory region.

DETAILED DESCRIPTION

Figure 1A:
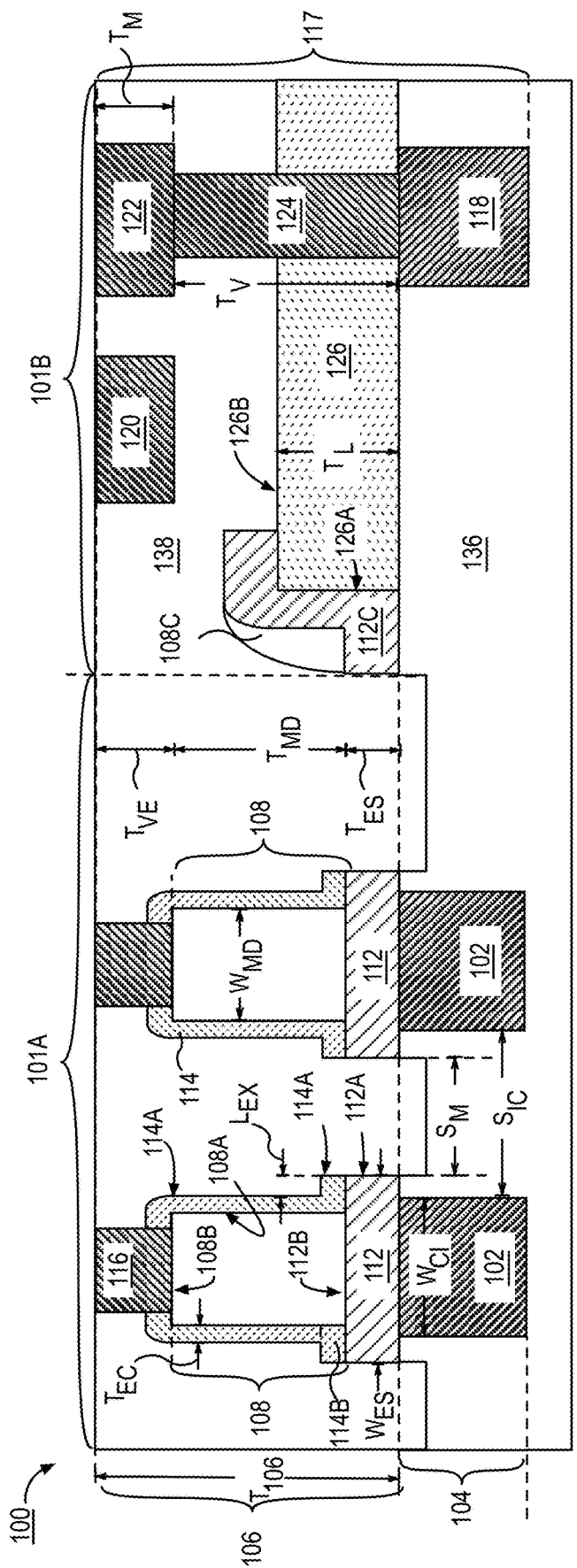
FIG. 1A is a cross-sectional illustration of a plurality of ferroelectric memory devices in a memory region adjacent to interconnect structures in a logic region, in accordance with an embodiment of the present disclosure.

Pedestal-based pocket integration process for embedded memory is described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment, is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment, may be combined with a second embodiment, anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Perovskite FeRAM devices are advantageous for high density memory applications owing to their low power consumption and high on/off ratio. Perovskite FeRAM device are also desirable over other forms of memory such as magnetic tunnel junction (MTJ)-based devices due to the relatively low number of layers within a device compared to the MTJ. A typical FeRAM may be fully operational with three layers, where a ferroelectric dielectric is contained between two electrode layers. The electrode layers may also include Perovskite materials to enable lattice matching and reduction in electrical resistance. Introduction of lead-free Perovskite materials offer additional environmental benefits without sacrificing device performance.

Ferroelectric capacitors may be integrated with transistors to form FeRAM devices in a memory region of a substrate. For example, ferroelectric capacitors may be on a memory level above a transistor level. There may be one or more layers of conductive interconnects between the ferroelectric capacitors (herein ferroelectric devices) and transistors in the transistor level. Ferroelectric devices in the memory region may be directly adjacent to a logic region within the memory level, for system functionality. In particular, the ferroelectric devices may be directly adjacent to routing interconnects in the logic region. A vertical thickness or height of a single level of routing interconnects (herein interconnect level) is determined by a combined thickness of one or more stacked vias and metal lines within the routing interconnects and is substantially fixed. To minimize fabrication cost, it is highly desirable to match a height of the memory level with a height of a single level of routing interconnects.

For manufacturability ferroelectric devices may be generally formed directly above conductive interconnects that are coupled with transistors on a lower level. Depending on a material of the conductive interconnects there may be one or more transition electrodes between a ferroelectric device and a conductive interconnect. For example, when the conductive interconnect includes copper, it is high desirable to not pattern a capacitor and expose the copper conductive interconnect.

For device functionality, each ferroelectric device is further coupled with a via electrode above the ferroelectric device. The memory level includes ferroelectric devices, via electrodes coupled with the ferroelectric devices, and transition electrodes. Thus, a height of the memory layer is a combination of individual thicknesses of the transition electrode, the ferroelectric device and the via electrode.

The ferroelectric devices span a height that depends on thickness of individual layers in the ferroelectric devices. Thus, depending on the thicknesses of the individual layers, the height of the ferroelectric devices can vary depending on application. In general, the transition electrode has a fixed thickness. In order to maintain a height of the memory level, individual thicknesses of the ferroelectric device and the via electrode may be co-dependently tuned. For example, when the ferroelectric device has a reduced thickness, the thickness of the via electrode may be increased, and vice versa.

To provide greater flexibility to tune the height of the memory device, it is desirable to also minimize a thickness of the transition electrode. In embodiments where the transition electrode includes copper, the transition electrode may be formed on the conductive interconnect prior to formation of a ferroelectric devices through a variety of processing methods, such as for example, a damascene process. A damascene process typically includes forming an insulator layer on the conductive interconnect, patterning the insulator layer to form an opening above the conductive interconnect, filling the opening with a suitable electrode material and planarizing. However, a planarization process often requires an insulator layer having a minimum thickness to be deposited. Even after planarization, to reduce the as deposited thickness, the resulting thickness of the insulator layer can substantially decrease a remaining height available within a given layer for fabrication of a capacitor. Process margins associated with planarization process can limit a thickness of a transition electrode above a minimum tolerable thickness.

In the logic area, thickness of the resulting transition electrode and insulator layer will dictate respective heights of individual vias and metal lines to be targeted. In exemplary embodiments, a respective via is coupled between one or more metal lines and a respective conductive interconnect. The vias are formed in a dielectric and in the insulator layer. The combined height of the via and metal lines remain unaltered. However, changing a thickness of the insulator layer to accommodate the ferroelectric device (in the memory region) necessitates targeting an etch to form the via. Frequent etch targeting based on insulator layer thickness may result in an incomplete etch and can hinder manufacturability.

The inventors have devised a method that enables decoupling between the thickness of the transition electrode in the memory area from the thickness of the insulator layer in the logic areas. The alternative method further facilitates formation of a transition electrode that can be tuned to a desired thickness based on a thickness of the ferroelectric device while maintaining a given substantially fixed thickness of the insulator in the logic region. The method utilizes a multistep subtractive patterning process where a first operation forms a ferroelectric device, and a second operation patterns the transition electrode. In an embodiment, the second process also includes patterning an encapsulation around the device. The total thickness of the transition electrode and the memory device can be co-dependently tuned.

To enable high density FeRAM devices the inventors have resorted to non-lead-based perovskite materials owing its environmental friendliness for mass production. A stack for ferroelectric capacitors can include one or more hardmask materials. The hardmask material can include dielectric materials, metallic materials or a combination thereof. Implementation of an etch with high selectivity (such as a reactive ion etching, or plasma etch process) between the hardmask and device layers can advantageously enable a total stack thickness that is less than a total thickness of layers within an adjacent conductive interconnect level.

In some embodiments, the conductive interconnects coupled with a respective ferroelectric device are discrete island structures. In other embodiments, the conductive interconnect may be a continuous trench line, where a plurality of capacitors may be coupled with the trench line. In some such embodiments, the transition electrode as well as the encapsulation layer may be continuous between a respective ferroelectric device and extend along a length of the trench line. In other embodiments, the conductive interconnect may be discrete, but the transition electrode as well as the encapsulation layer may be continuous between each respective capacitor. In further embodiments, the conductive interconnects are discrete, but a top electrode of individual ferroelectric capacitors are coupled together by a single conductive plate.

FIG. 1A is a cross-sectional illustration of a device structure 100, including a first region 101A, adjacent to a second region 101B. The region 101A and 101B may be for example a memory region and a logic region, respectively or vice versa. In the illustrative embodiment, region 101A is a memory region and region 101B is a logic region. The memory region 101A includes a plurality of conductive interconnects, such as interconnect 102 within level 104. The device structure 100 further includes second level 106 above level 104. Level 106 may include ferroelectric devices. In the illustrative embodiment, level 106 includes a plurality of ferroelectric devices, such as ferroelectric memory device 108 above a respective conductive interconnect 102. As shown, an electrode structure 112 is coupled between a respective ferroelectric memory device 108 and a respective conductive interconnect 102. To protect layers within ferroelectric memory device 108 from degradation during a fabrication process, an encapsulation layer 114 may be present on sidewalls and on top surfaces of ferroelectric memory device 108, as shown. In the illustrative embodiment, encapsulation layer 114 is on sidewalls 108A and on top surface 108B of ferroelectric memory device 108.

In exemplary embodiments, electrode structure 112 is wider than the ferroelectric memory device 108, as shown in the Figure. In some such embodiments, an outermost surface 114A of the encapsulation layer 114 is substantially aligned with sidewall 112A of the electrode structure 112. In the illustrative embodiment, encapsulation layer 114 extends laterally on a top surface 112B of electrode structure 112, beyond a thickness, $T_{EC}$, as measured from sidewalls 108A. Lateral extensions 114B may have a length, $L_{EX}$, as measured laterally from sidewall 108A. $L_{EX}$ may be between 5 nm and 10 nm. It is to be appreciated that lateral extensions 114B of encapsulation layer 114 may not be symmetrical about the ferroelectric memory device 108. For example, $L_{EX}$ may be different on opposing sidewalls 108A (in the cross-sectional illustration).

Figures 1B, 1C, 1D, 1E:
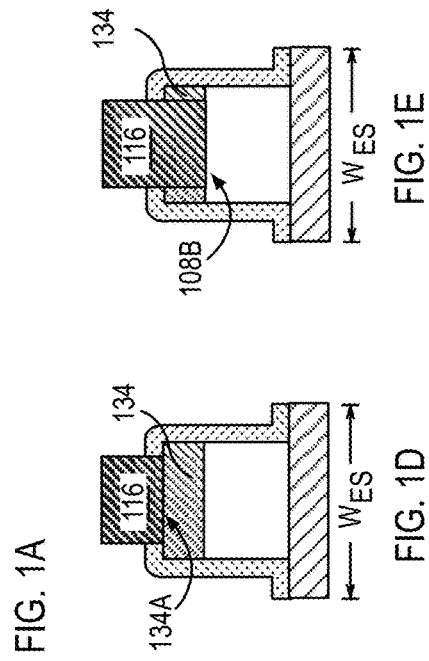
FIG. 1B is a cross-sectional illustration of a ferroelectric memory device above a transition electrode, where a lateral thickness of the transition electrode is equal to a lateral thickness of the ferroelectric memory device and two times a thickness of a spacer adjacent to the transition electrode, in accordance with an embodiment of the present disclosure.
FIG. 1C is a cross-sectional illustration of layers within a ferroelectric memory device that includes a hardmask, in accordance with an embodiment of the present disclosure.
FIG. 1D is a cross-sectional illustration of a ferroelectric memory device that includes a conductive hardmask, in accordance with an embodiment of the present disclosure.
FIG. 1E is a cross-sectional illustration of a ferroelectric memory device that includes a dielectric hardmask, in accordance with an embodiment of the present disclosure.

In some embodiments, encapsulation layer 114 has a thickness that is sufficiently large that encapsulation layer 114 does not extend laterally beyond thickness, $T_{EC}$ as illustrated in FIG. 1B. In some embodiments, $T_{EC}$ can also vary as a function of height or vertical thickness, $T_{MD}$ of ferroelectric memory device 108. $T_{EC}$ may increase or decrease with $T_{MD}$.

Referring again to FIG. 1A, level 106 also includes a via electrode 116 coupled with a respective ferroelectric memory device 108. As shown, electrode structure 112 has a vertical thickness, $T_{ES}$, memory device 108 has a vertical thickness $T_{MD}$, and via electrode 116 has a vertical thickness, $T_{VE}$. Level 106 has a vertical thickness, $T_{106}$ that is substantially equal to a combined sum of $T_{ES}$, $T_{MD}$, and $T_{VE}$. It is to be appreciated that individual thicknesses $T_{ES}$, $T_{MD}$, and $T_{VE}$ may be independently chosen to optimize the ferroelectric memory device 108.

In the illustrative embodiment, logic region 101B includes an interconnect structure 117 spanning levels 104 and 106. Interconnect structure 117 includes one or more conductive interconnects in level 104 and one or more vias and metal lines coupled with conductive interconnect 118 in level 106. In the illustrative embodiment, interconnect structure 117 includes conductive interconnect 118 in level 104 and a plurality of metal lines 120 and 122, where metal line 122 is coupled with conductive interconnect 118 through via 124. Metal line 122 may be coupled with a conductive interconnect through a via on a different plane, behind the plane of the illustration.

Via 124 has a vertical thickness, $T_V$, as measured from a lower most point of level 104 or from uppermost surface 118A of conductive interconnect 118, and metal line 122 has a vertical thickness, $T_M$. In exemplary embodiments, a combined sum of $T_M$ and $T_V$ is equal to a combined sum of individual thicknesses $T_{ES}$, $T_{MD}$, and $T_{VE}$. In general, $T_M$ and $T_{VE}$ need not be equal. In some embodiments, $T_{VE}$ is between 0 and 20% of $T_M$. In some embodiments, $T_M$ is between 20 nm and 50 nm. In other embodiments, $T_M$ is between 20 nm and 200 nm.

In an embodiment, $T_{MD}$ has a thickness between 10 nm and 100 nm and $T_{ES}$ has a thickness between 2 nm and 20 nm. In an embodiment, sum of $T_{MD}$ and $T_{ES}$ is approximately between 0-15% of $T_V$. In some embodiments, $T_V$ is between 20 nm and 50 nm. In other embodiments, $T_V$ is between 20 nm and 150 nm.

Logic region 101B also includes an etch stop layer 126 between the conductive interconnect 118 and metal line 122. In the illustrative embodiment, etch stop layer 126 spans the logic region 101B, and is directly on conductive interconnect 118. Via 124 is coupled with conductive interconnect 118 through etch stop layer 126.

Etch stop layer 126 may be thicker than, thinner than, or have a same thickness as the electrode structure 112. Etch stop layer 126 has a thickness, $T_L$. In general $T_L$ and $T_{ES}$, can be independent of each other. $T_{ES}$ may be based on a combined thickness of individual layers within the ferroelectric memory devices 108. $T_L$ may be based on a desired profile and thickness of via 124, as will be discussed below. In some embodiments, $T_{ES}$ can be up to 25% of $T_L$. In other embodiments, $T_{ES}$ is between 25%-50% of $T_L$.

In some embodiments, portion 112C of electrode structure 112 and one or more layers (herein stack portion 108C) of the ferroelectric memory device 108 can be adjacent to the etch stop layer 126, as shown. In the illustrative embodiment, portion 112C extends on dielectric 136, on sidewall 126A and on top surface 126B of etch stop layer 126. The portion 112C may be an artifact of a processing methodology utilized to fabricate device structure 100. Portion 112C may have a same or different thicknesses on the dielectric 136, on sidewall 126A and on top surface 126B. Stack portion 108C may extend to various heights along an outer sidewall of portion 112C. Other embodiments of device structure 100 may not include stack portion 108C, or portion 112C.

In the illustrative embodiment, each ferroelectric memory device 108 within device structure 100 are substantially identical. While two ferroelectric memory device 108 are illustrated, an array can have more than 1000 substantially identical ferroelectric memory devices 108. Adjacent electrode structures 112 under each ferroelectric memory device 108 may be laterally separated from each other by a distance, $S_M$. $S_M$ may range between 20 nm and 50 nm. The separation, $S_M$, is dependent on separation Sic between adjacent conductive interconnects 102 as well as on lateral thicknesses, $W_{CI}$ and $W_{ES}$ of the conductive interconnect 102 and electrode structure 112, respectively, as will be discussed further below.

In some embodiments, $S_M$ may depend on a stack of layers within the ferroelectric memory device 108. Depending on embodiments, ferroelectric memory device 108 can have three or more layers. An embodiment of the ferroelectric memory device 108 including four layers is illustrated in FIG. 1C. As shown, ferroelectric memory device 108 includes a bottom electrode 128, a ferroelectric oxide layer 130 and a top electrode 132.

In an embodiment, bottom electrode 128 and top electrode 132 include a conductive ferroelectric oxide. The conductive ferroelectric oxide includes one of a non-Pb perovskite metal oxides, such as but not limited to, La—Sr—CoO$_3$, SrRuO$_3$, La—Sr—MnO$_3$, YBa$_2$Cu$_3$O$_7$, BizSr$_2$CaCu$_2$O$_8$, or LaNiO$_3$.

In an embodiment, ferroelectric oxide layer 130 is a ferroelectric dielectric layer that includes non-Pb perovskite material in the form ABO$_3$, where A and B are two cations of different sizes and O is Oxygen. A is generally larger than B in size. In some embodiments, non-Pb Perovskites can also be doped, e.g., by La or Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, ferroelectric dielectric layer includes low voltage ferroelectric material sandwiched between top electrode 132 and bottom electrode 128. These low voltage FE materials can be of the form AA'BB'O$_3$, where A' is a dopant for atomic site A and can be an element from the Lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below X-Volts is sufficiently low to be characterized as low voltage.

Ferroelectric memory device 108 may also include hardmask 134 as shown. In some embodiments, hardmask 134 may be dielectric hardmask 134, where the dielectric includes a material such as silicon and one or more of nitrogen, oxygen or carbon. In other embodiments, hardmask 134 includes a conductive material, for example, tantalum, titanium, ruthenium, or an alloy of nitrogen and one or more of tantalum, titanium, ruthenium. The combined thickness of the layers in ferroelectric memory device 108 can range between 7 nm and 100 nm.

In some embodiments, where ferroelectric memory device 108 includes hardmask 134, material of hardmask 134 will determine whether the via electrode 116 contacts the hardmask 134 or extends through a portion of the hardmask 134 and contacts top electrode 132. As shown in FIG. 1D, where hardmask 134 includes a conductive material, via electrode 116 is in contact with uppermost hardmask surface 134A. In other embodiments, where hardmask 134 includes a dielectric material, via electrode 116 extends through hardmask 134 and is in contact with uppermost surface 108B, as shown in FIG. 1E.

Referring again to FIG. 1A, conductive interconnect 118 has one or more properties of conductive interconnect 102. Conductive interconnects 102 and 118 include a metal such as copper, cobalt, molybdenum, tungsten or ruthenium. In some embodiments, conductive interconnects 102 and 118 include a liner layer and a fill metal on the liner layer. For example, the liner layer may include a material, such as but not limited to, ruthenium, cobalt or tantalum and the fill metal may include copper or tungsten. Conductive interconnects 102 and 118 have a thickness that spans a portion of dielectric 136 within level 104. There may be other vias and interconnect routing connections within level 104 that are not shown in the Figure. In an embodiment, via electrode 116, via 124, metal lines 120 and 122, include a same or substantially the same material. In some embodiments, via electrode 116, via 124, metal lines 120 and 122, include a same or substantially the same material as the material of the conductive interconnect 102. In different embodiments, via electrode 116, via 124, conductive interconnects 102 and 118 may be discrete vias or continuous trenches.

Figure 1F:
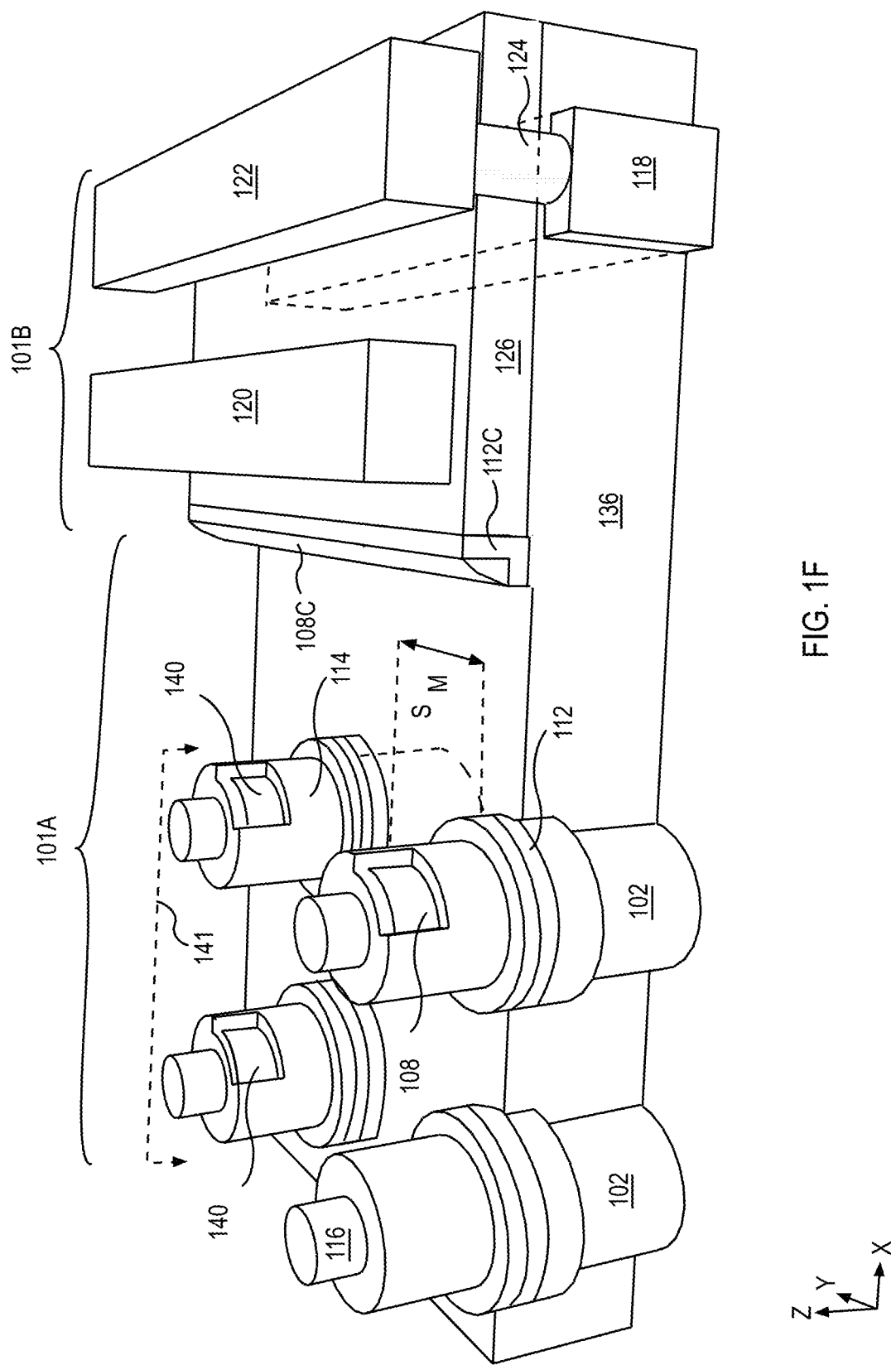
FIG. 1F illustration is an isometric illustration of the structure in FIG. 1A illustrating a plurality of memory devices in the memory region directly adjacent to interconnect structures in the logic region.

In accordance with an embodiment of the present disclosure, FIG. 1F is an isometric illustration of the device structure 100 in FIG. 1A, where the conductive interconnect 102 are discrete islands. As shown, memory region 101A, within device structure 100, further includes a plurality of memory devices such as ferroelectric memory device 140 (illustrated through a cut out in encapsulation layer 114). Ferroelectric memory devices 140 are on plane 141, behind ferroelectric memory devices 108. Ferroelectric memory device 140 is substantially identical to and has all the properties of ferroelectric memory device 108. In the illustrative embodiment, each ferroelectric memory device 140 is coupled with a conductive interconnect 102 having a discrete island structure (i.e., a conductive interconnect structure surrounded by dielectric 136). in the illustrative embodiment, each ferroelectric memory device 140 is spaced apart from a respective ferroelectric device 108 by a distance, $S_M$ along the y-direction. In the illustrative embodiment, a discrete via electrode 116 is coupled with respective ferroelectric memory device 108 or ferroelectric memory device 140.

In the illustrative embodiment, the respective ferroelectric memory device 108 or ferroelectric memory device 140 have a cylindrical shape. As shown, electrode structure 112 also has a cylindrical shape.

In the illustrative embodiment, conductive interconnect 118 is a conductive trench interconnect 118 that extends along the y-direction. As shown, metal lines 120 and 122 also extend along the y-direction. In some embodiments, via 124 is conductive via between metal line 122 and conductive interconnect 118. In other embodiments, interconnect structure 117 can include a plurality of vias such as via 124 between metal line 122 and conductive interconnect 118 to prevent an increase in electrical line resistance. In the illustrative embodiment, portion 112C and stack portion 108C both extend along the y-direction, parallel to the metal lines 120 and 122.

Figure 1H:
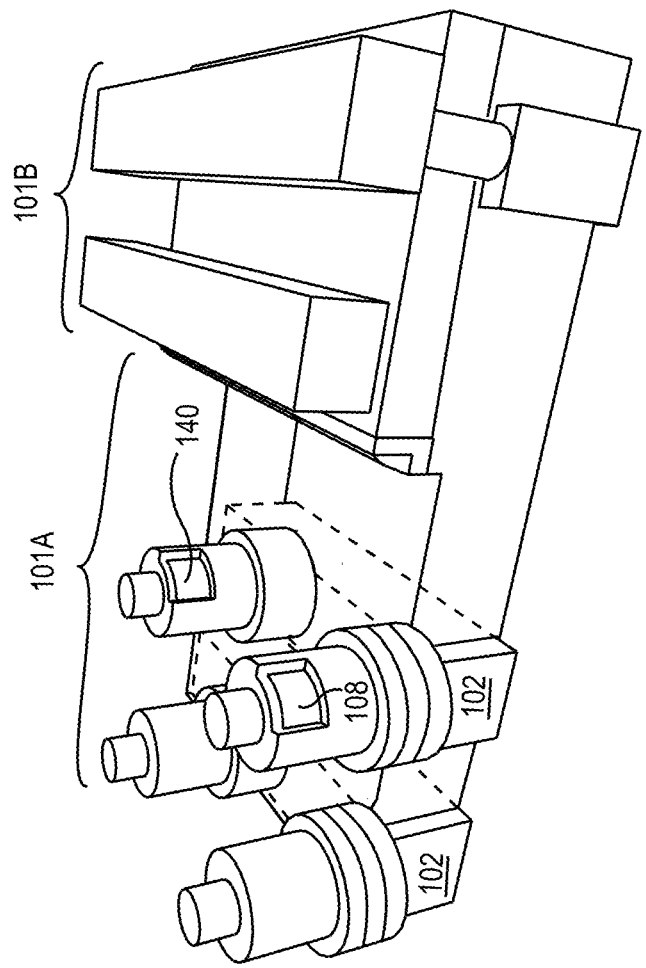
FIG. 1H is an isometric illustration of a plurality of ferroelectric memory devices in a memory region adjacent to interconnect structures in a logic region, where conductive interconnects in the memory region are trenches that couple more than one ferroelectric memory device, in accordance with an embodiment of the present disclosure.
Figure 1G:
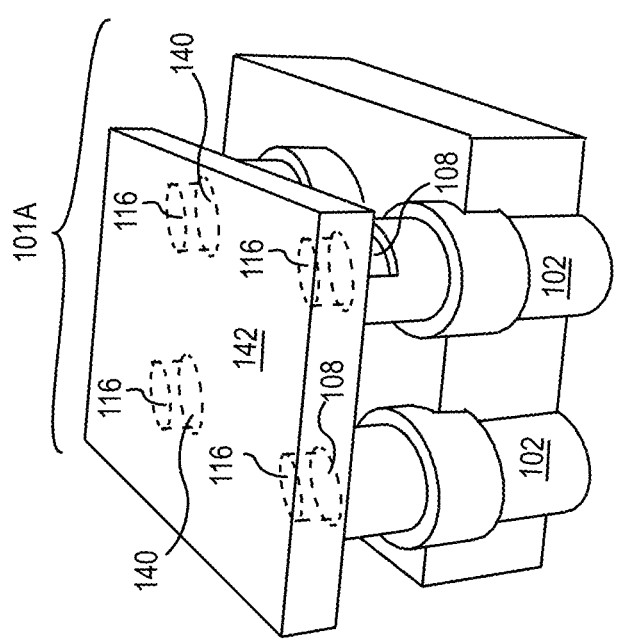
FIG. 1G is an isometric illustration of a plurality of ferroelectric memory devices in a memory region where a top electrode of individual ones of the plurality of ferroelectric memory devices are coupled to a common planar electrode, in accordance with an embodiment of the present disclosure.

In some embodiments, ferroelectric memory devices 108 and ferroelectric memory devices 140 are coupled together by a common plate electrode 142, such as is shown in the cross-sectional illustration of FIG. 1G. In one such embodiment, plate electrode 142 may extend over and be coupled with each ferroelectric memory device 108 and 140, through a respective via electrode 116, as shown. Logic region 101B is not illustrated for clarity.

In some embodiments, conductive interconnect 102 may continuously extend under and from ferroelectric memory device 108 to ferroelectric memory device 140, as illustrated in FIG. 1H. In some such embodiments, conductive interconnect 102 includes a material that is different from copper. However, it is to be appreciated that while electrode structure 112 may extend laterally above conductive interconnect 102 along a width (x-direction), electrode structure 112 does not extend continuously over conductive interconnect 102 between ferroelectric memory device 108 and ferroelectric memory device 140, along the y-direction.

Figure 2B:
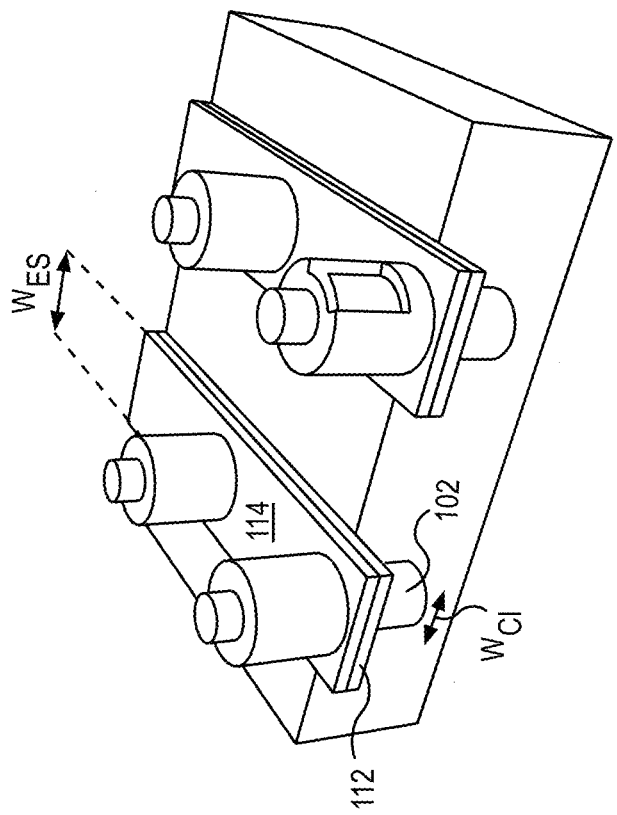
FIG. 2B is an isometric illustration of a plurality of ferroelectric memory devices in a memory region, where conductive interconnects in the memory region are discrete islands structure, but where a bottom electrode of individual ones of a plurality of ferroelectric memory devices, along a given line, are coupled by a common electrode, in accordance with an embodiment of the present disclosure.
Figure 2A:
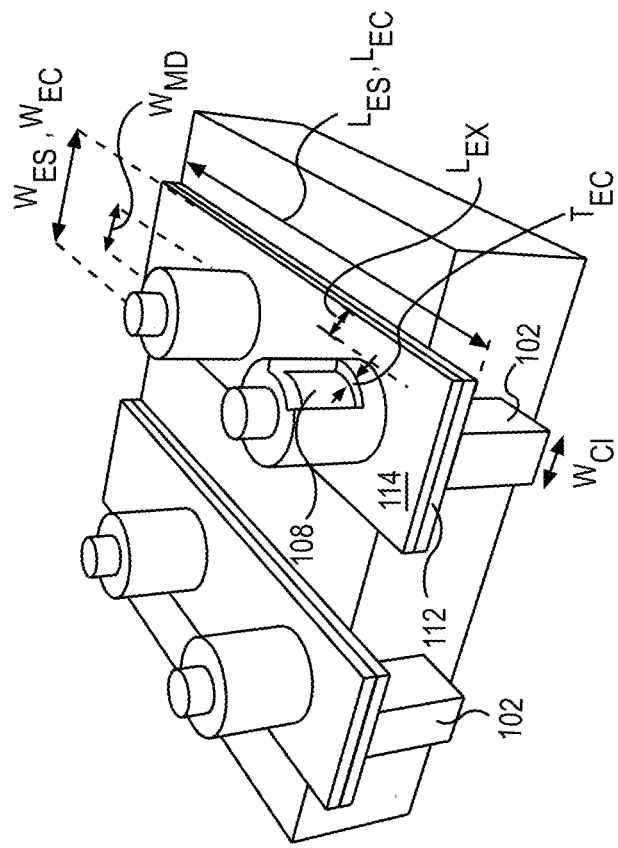
FIG. 2A is an isometric illustration of a plurality of ferroelectric memory devices in a memory region, where conductive interconnects in the memory region are trenches that couple more than one ferroelectric memory device, in accordance with an embodiment of the present disclosure.

In some embodiments, when conductive interconnect 102 extends along the y-direction but includes a material such as copper, electrode structure 112 can also extend along the y-direction, as illustrated in FIG. 2A. As shown, conductive interconnect 102 continuously extends along a y-direction, under ferroelectric memory devices 108 and 140, and in a region between ferroelectric memory devices 108 and 140 (not visible). In some such embodiments, electrode structure 112 has a width, $W_{ES}$, that is greater than a width, $W_{CI}$, of conductive interconnect 102 to prevent copper exposure to encapsulation layer 114. In further some such embodiments, encapsulation layer 114 also extends over electrode structure 112. In the illustrative embodiment, encapsulation layer 114 has a same or substantially the same lateral thickness or width, $W_{EC}$, and a length, $L_{EC}$, as lateral thickness, $W_{ES}$ and length LES, respectively of electrode structure 112. In the illustrative embodiment, encapsulation layer 114 has a lateral extension, $L_{EX}$, that extends beyond sidewalls 108A, where $L_{EX}$ is greater than a thickness of the encapsulation layer, $T_{EC}$. If ferroelectric memory device 108 is equal to or wider than $W_{CI}$, then lateral extension of encapsulation layer 114 can provide a margin for protecting conductive interconnect 102 during processing.

In the illustrative embodiment, the respective ferroelectric memory device 108 or ferroelectric memory device 140 have a cylindrical shape. In some such embodiments $W_{MD}$, is a diameter the respective ferroelectric memory device 108 or ferroelectric memory device 140.

In other embodiments, conductive interconnect 102 can be discrete islands but electrode structure 112 can be coupled with each conductive interconnect 102 along a given direction, as shown in FIG. 2B. In the illustrative embodiment, electrode structure 112 and encapsulation layer 114 have one or more properties such as length, LES and $L_{EC}$ and width, $W_{ES}$ and $W_{EC}$ of electrode structure 112 and encapsulation layer 114, respectively, as described in association with FIG. 2A. As shown, each discrete conductive interconnect 102 has a widest dimension, $W_{CI}$, that is less than width, $W_{ES}$, of electrode structure 112 to cover an uppermost surface of conductive interconnect 102. It is to be appreciated that in the illustrative embodiment, conductive interconnect 102 can include a material such as copper. Logic region 101B is not illustrated for clarity.

Figure 3B:
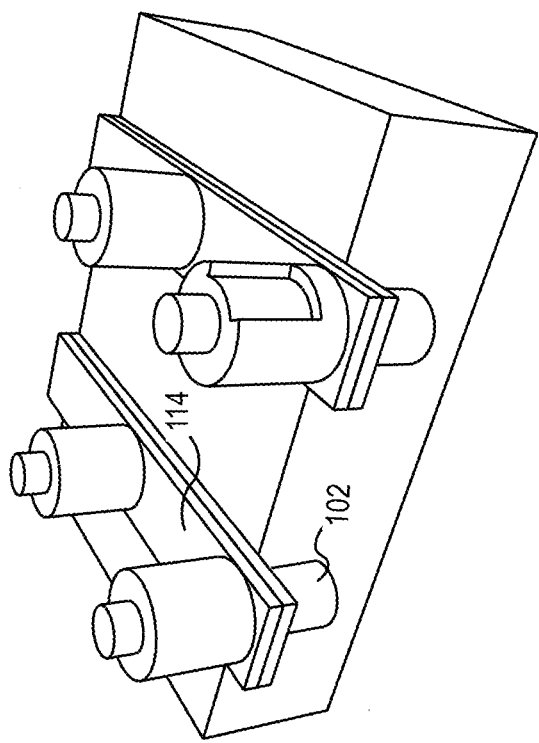
FIG. 3B is an isometric illustration of a plurality of ferroelectric memory devices in a memory region, where conductive interconnects in the memory region are discrete islands structure, but where a bottom electrode of individual ones of plurality of ferroelectric memory devices along a given line are coupled by a common electrode, in accordance with an embodiment of the present disclosure.
Figure 3A:
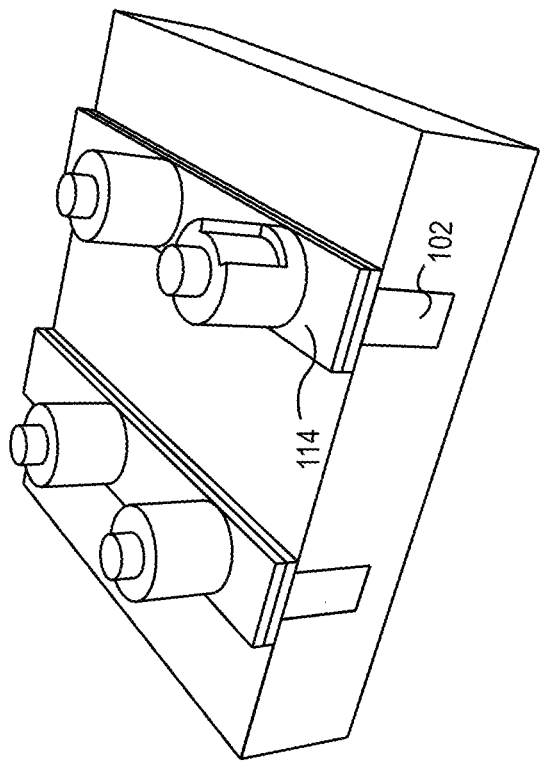
FIG. 3A is an isometric illustration of a plurality of ferroelectric memory devices in a memory region, where conductive interconnects in the memory region are trenches that couple more than one ferroelectric memory device, in accordance with an embodiment of the present disclosure.

FIG. 3A is an embodiment of the structure in FIG. 2A, where encapsulation layer 114 does not have a lateral extension that extends beyond a thickness of encapsulation layer 114. However, in the illustrative embodiment, encapsulation layer 114 extends above conductive trench interconnect 102.

FIG. 3B is an embodiment of the structure in FIG. 2B, where encapsulation layer 114 does not have a lateral extension that extends beyond a thickness of the encapsulation layer 114. However, in the illustrative embodiment, encapsulation layer 114 continuously extends above each discrete conductive trench interconnect 102, along the y-direction.

Figure 4B:
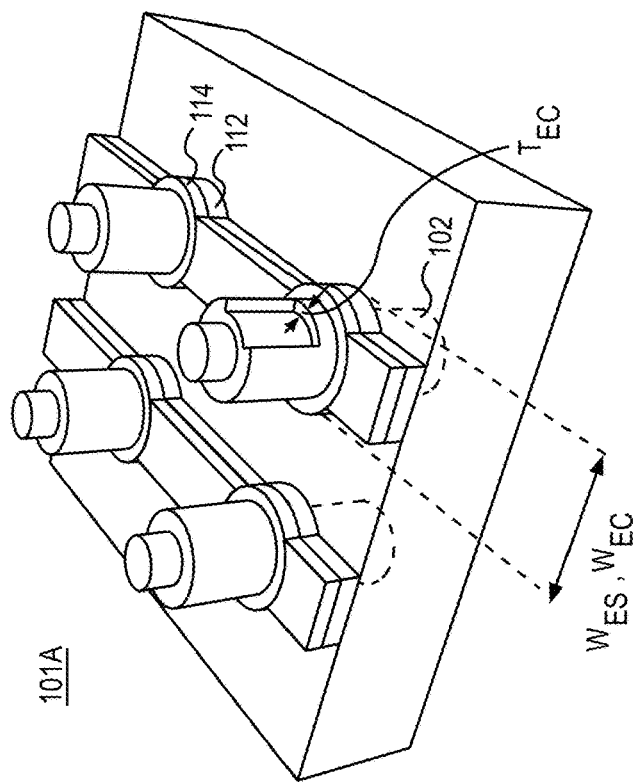
FIG. 4B is an isometric illustration of a plurality of ferroelectric memory devices in a memory region, where conductive interconnects in the memory region are discrete islands structure, but where a bottom electrode of individual ones of plurality of ferroelectric memory devices along a given line are coupled by a common electrode, in accordance with an embodiment of the present disclosure.
Figure 4A:
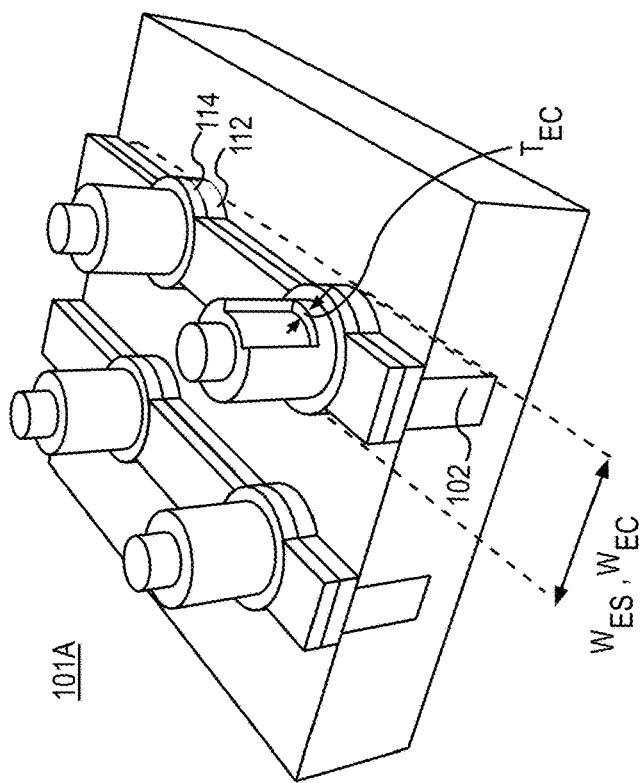
FIG. 4A is an isometric illustration of a plurality of ferroelectric memory devices in a memory region, where conductive interconnects in the memory region are trenches that couple more than one ferroelectric memory device, in accordance with an embodiment of the present disclosure.

FIG. 4A is an embodiment of the structure in FIG. 2A, where encapsulation layer 114 has a lateral extension that extends beyond a thickness, $T_{EC}$, of encapsulation layer 114, but the lateral thickness, or width, $W_{EC}$, and $W_{ES}$ vary along the y-direction. In the illustrative embodiment, encapsulation layer 114 extends above conductive trench interconnect 102.

FIG. 4B is an embodiment of the structure in FIG. 2B, where encapsulation layer 114 has a lateral extension that extends beyond a thickness, $T_{EC}$, of encapsulation layer 114, but the lateral thickness, or width, $W_{EC}$, and $W_{ES}$ vary along the y-direction. However, in the illustrative embodiment, encapsulation layer 114 continuously extends above each discrete conductive trench interconnect 102, along the y-direction.

Figure 5:
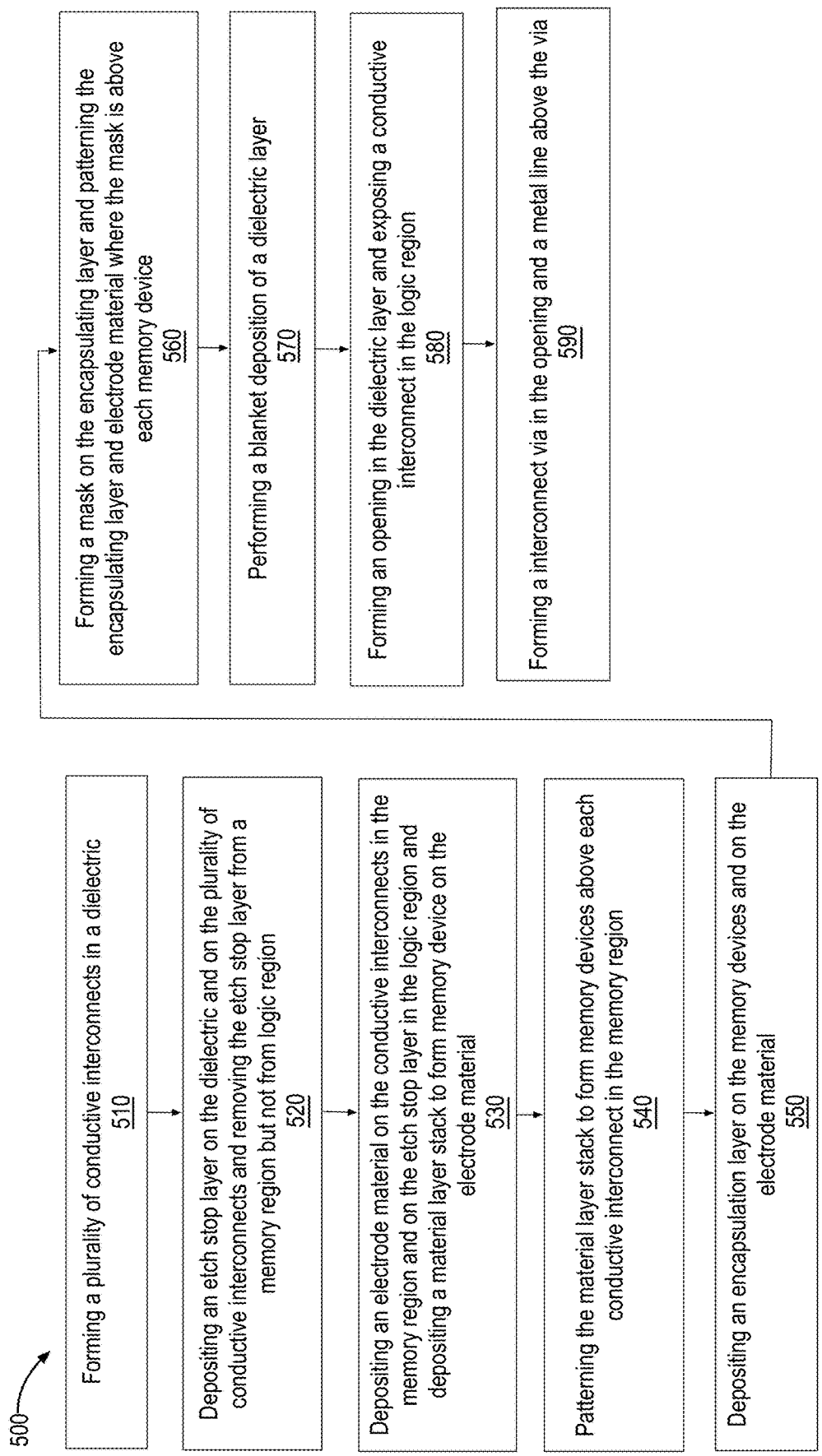
FIG. 5 is a flow diagram of a method to fabricate a ferroelectric memory device adjacent to interconnects in a logic region, in accordance with an embodiment of the present disclosure.

FIG. 5 is a flow diagram to form a plurality of ferroelectric memory devices in a memory region and conductive interconnects in a logic region, in accordance with an embodiment of the present disclosure. Some operations can be performed simultaneously or out of order. The method begins at operation 510, with the formation of plurality of conductive interconnects in a dielectric. The method 500 continues at operation 520 with the deposition of an etch stop layer on the dielectric and on the plurality of conductive interconnects and removing the etch stop layer from a memory region but not from a logic region. The method continues at operation 530 with the deposition of an electrode material on the conductive interconnects in the memory region and on the etch stop layer in the logic region and deposition of a material layer stack to form memory devices on the electrode material. The method continues at operation 540 with the process to pattern the material layers stack for memory devices above each conductive interconnect in the memory region. The method continues at operation 550 with the deposition of an encapsulation layer on the memory devices and on the electrode material. The method continues at operation 560 with the formation of a mask on the encapsulating layer and patterning the encapsulating layer and electrode material, where the mask is above each memory device. The method continues at operation 570 with a blanket deposition of a dielectric layer. The method continues at operation 580 with the formation of one or more openings in the dielectric layer and exposing one or more conductive interconnects in the logic region. The method concludes at operation 590 with the formation of one or more interconnect vias in the one or more openings and a metal line on a respective interconnect via.

Figure 6A:
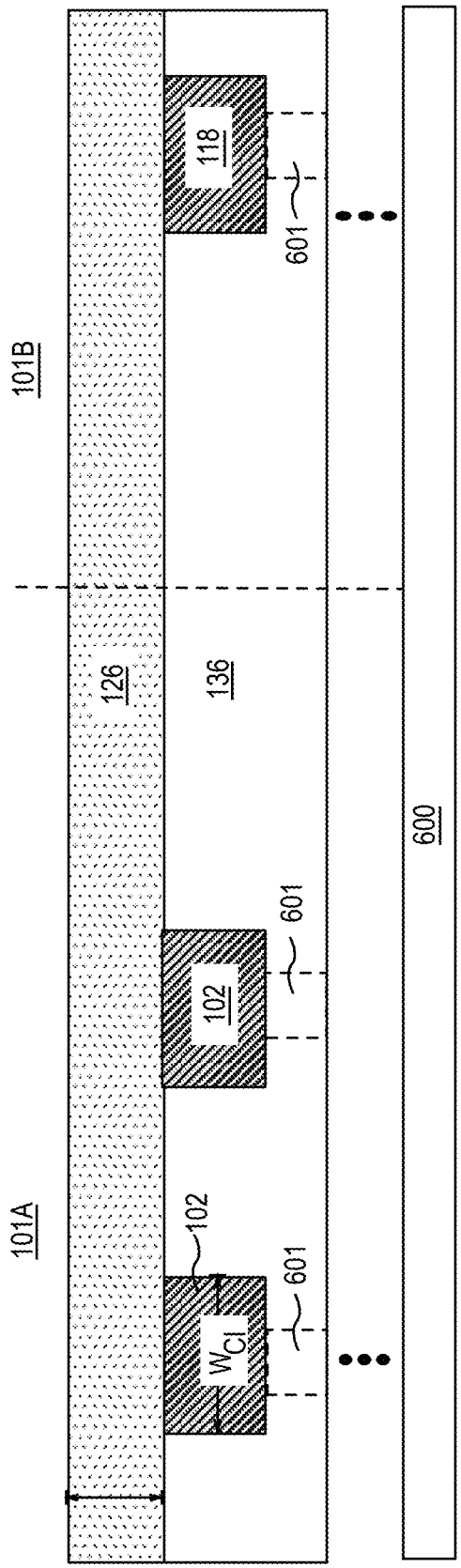
FIG. 6A is a cross-sectional illustration of a plurality of conductive interconnects formed within a first dielectric in a memory region and in a logic region above a substrate and following the formation of an etch stop layer on the conductive interconnects.

FIG. 6A is a cross-sectional illustration of a plurality of conductive interconnects 102 and 118 formed within dielectric 136 above substrate 600. In the illustrative embodiment, conductive interconnects 102, are formed in a memory region and conductive interconnect 118 is formed in a logic region. In exemplary embodiments, there may be one or more levels of transistors and interconnects between conductive interconnects 102 and 118 and substrate 600. In high density memory applications, the number of conductive interconnects can range between 1K and 5K within a given array in memory region 101A. Conductive interconnects 102 and 118 have a lateral thickness, $W_{CI}$, that may be determined by a minimum acceptable electrical resistance. In some embodiments, conductive interconnects 102 are discrete structures that are substantially circular or elliptical in shape and conductive interconnect 118 is a trench line (extending into the plane of the Figure). Conductive interconnects 102 may have a maximum lateral thickness between 20 nm and 40 nm. For example, conductive interconnects 102 may have a lateral thickness between 20 nm and 40 nm, along the x-direction, as shown. In other embodiments, conductive interconnects 102 and 118 are lines that extend into the plane of the Figure. As shown, conductive interconnects 102 and 118 have substantially the same lateral thickness to minimize variability in device performance.

In some embodiments, the conductive interconnects 102 and 118 are electrically and mechanically coupled with vias and/or lines such as via 601 and/or line 601 indicated in dashed boxes in the Figure. The via 601 and/or line 601 may include a same or substantially the same material as a material of the conductive interconnect 102.

In some embodiments, conductive interconnects 102 and 118 include a liner layer and a fill metal on the liner layer. For example, the liner layer may include a material, such as but not limited to, ruthenium, cobalt or tantalum and the fill metal may include copper or tungsten. In one or more embodiments, conductive interconnects 102 and 118 include copper fill metal on a ruthenium or a tantalum liner. In an embodiment, each of the conductive interconnects 102 are separated by spacing $S_{IC}$. $S_{IC}$ is substantially determined by a designed density of ferroelectric memory devices to be fabricated within a given area, as well as by underlying structures embedded within layers below conductive interconnects 102.

In an embodiment, etch stop layer 126 is deposited on conductive interconnects 102 and 118 as well as on the dielectric layer 204. Etch stop layer 126 is deposited to a thickness that is chosen to accommodate a height of a via to be formed, as well as to target an etch in logic region 101B in a downstream operation. In an embodiment, etch stop layer 126 also serves as a diffusion barrier layer. A diffusion barrier layer is essential for preventing diffusion of copper from conductive interconnect 118 to the ferroelectric memory devices to be formed. As such, etch stop layer 126 includes a material such as but not limited to silicon and one or more of nitrogen, oxygen, or carbon.

Figure 6B:
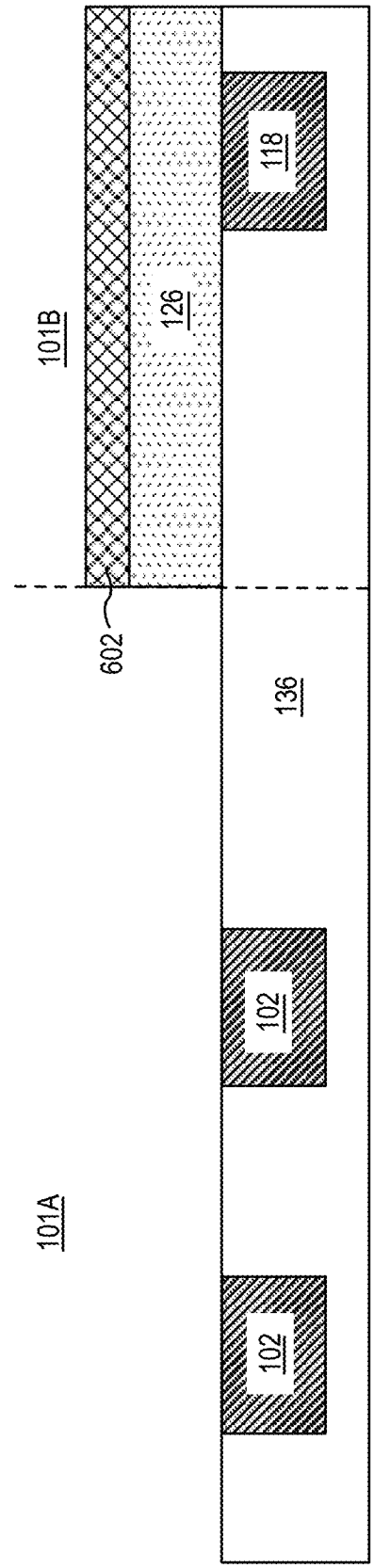
FIG. 6B is a cross-sectional illustration of the structure in FIG. 6A following the process to etch a portion of an etch stop layer from a memory region.

FIG. 6B is a cross-sectional illustration of the structure in FIG. 6A following the process to etch a portion of etch stop layer 126 from a memory region. In an embodiment, photoresist mask 602 is formed by a lithographic process on etch stop layer 126. Exposed portions of etch stop layer 126 may be etched by a plasma etch process through opening in the photoresist mask 602. The etch process isolates etch stop layer 126 to logic region 101B and exposes dielectric 136 and conductive interconnects 102 in the memory region. The substrate 600 is not illustrated in FIGS. 6B-9B, for clarity.

Figure 6C:
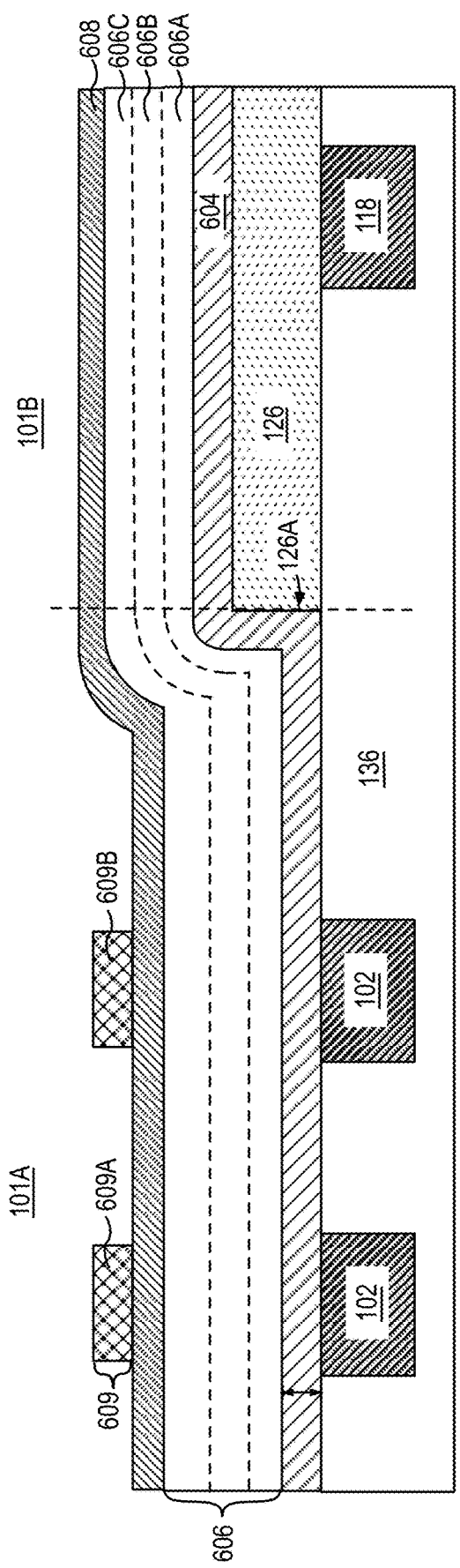
FIG. 6C is a cross-sectional illustration of the structure in FIG. 6B following the process to deposit an electrode material on the conductive interconnects in the memory region, on a first dielectric and on the etch stop layer and following the formation of a material layer stack to form ferroelectric memory devices.

FIG. 6C is a cross-sectional illustration of the structure in FIG. 6B following the process to deposit an electrode material 604 on conductive interconnects 102, on dielectric 136 and on etch stop layer 126. The deposition process continues with blanket deposition of a material layer stack 606 for the formation of ferroelectric memory devices on electrode material 604 followed by deposition of hardmask layer 608 on material layer stack 606 and formation of a mask 609 on hardmask layer 608, in accordance with an embodiment of the present disclosure. In an exemplary embodiment, etch stop layer 126 and individual layers of material layer stack 606 are deposited in situ, i.e., without breaking vacuum. Material layer stack 606 maybe deposited by an atomic layer deposition (ALD) process, a plasma enhanced chemical vapor deposition (PECVD), chemical vapor deposition (CVD) or a physical vapor deposition (PVD) process. In some embodiments, conductive layer 606A is blanket deposited on electrode material 604. In an exemplary embodiment, conductive layer 606A includes a conductive ferroelectric oxide. The conductive ferroelectric oxide includes one of a non-Pb perovskite metal oxides, such as but not limited to, La—Sr—$CoO_3$, $SrRuO_3$, La—Sr—$MnO_3$, $YBa_2Cu_3O_7$, $BiZSr_2CaCu_2O_8$, or $LaNiO_3$.

Conductive layer 606A is deposited to a thickness, $T_1$, that is suitable for minimizing electrical resistance and to minimize tapering of sidewalls during a patterning process that will be utilized to fabricate ferroelectric memory devices. In some embodiments, conductive layer 606A has a thickness that is between 3 nm and 30 nm. A thickness of less than 30 nm is highly desirable to prevent significant tapering in sidewalls during the patterning process.

The deposition process is continued by deposition of ferroelectric dielectric layer 606B. In an exemplary embodiment ferroelectric dielectric layer 606B is blanket deposited on the conductive layer 606A. Ferroelectric dielectric layer 606B has a thickness, $T_2$, that is between 1 nm and 30 nm. In some embodiments, ferroelectric dielectric layer 606B includes non-Pb Perovskite material in the form $ABO_3$, where A and B are two cations of different sizes and O is Oxygen. A is generally larger than B in size. In some embodiments, non-Pb Perovskites can also be doped, e.g., by La or Lanthanides. The non-Pb Perovskite material can include one or more of La, Sr, Co, Cr, K, Nb, Na, Sr, Ru, Y, Fc, Ba, Hf, Zr, Cu, Ta, Bi, Ca, Ti and Ni.

In other embodiments, ferroelectric dielectric layer 606B includes a low voltage ferroelectric material sandwiched between the conductive oxide layers (606A and 606B). Low voltage materials can be of the form $AA'BB'O_3$, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of conductive layer 606C on ferroelectric dielectric layer 606B. In an exemplary embodiment, the conductive layer 606C includes a material that is the same or substantially the same as the material of conductive layer 606A. When conductive layers 606A and 606C include the same material, the material layer stack is symmetric. In different embodiments, conductive layer 606C can have a different thickness than conductive layer 606A. In embodiments, conductive layer 606C is deposited to a thickness, $T_3$, between 3 nm and 30 nm. Conductive layer 606C between 3 nm and 30 nm can facilitate the patterning process.

The deposition process concludes with the formation of hardmask layer 608 on conductive layer 606C. In some embodiment, hardmask layer 608 is blanket deposited by a PECVD, CVD or PVD process. In an embodiment, hardmask layer 608 includes a material that has a favorable etch selectivity compared to the ferroelectric materials in material layer stack 606. In some embodiments, hardmask layer 608 includes materials that can be patterned with high fidelity with respect to a masking layer formed on hardmask layer 608, for example, $SiO_2$, $Si3N_4$ DLC (Diamond Like Carbon) or $Al_2O_3$. In other embodiments, hardmask layer 608 includes a conductive material that is different from the conductive material of the ferroelectric material. In some embodiments it is desirable to deposit hardmask layer 608 to a thickness, $T_4$, that enables patterning of at least conductive layer 606C. In other embodiments, hardmask layer 608 may deposited to a thickness, $T_4$, that depends on a total thickness of material layer stack 606. $T_4$ may be at least 20 nm. In a different embodiment, hardmask layer 608 includes a bilayer where the bilayer includes a metallic layer and a dielectric on the metallic layer.

In an embodiment, photoresist mask 609 is formed on hardmask layer 608 and is formed by a lithographic process. The photoresist mask 609 includes blocks 609A and 609B. Each block 609A-B is a mask for patterning a discrete FeRAM device.

Figure 6D:
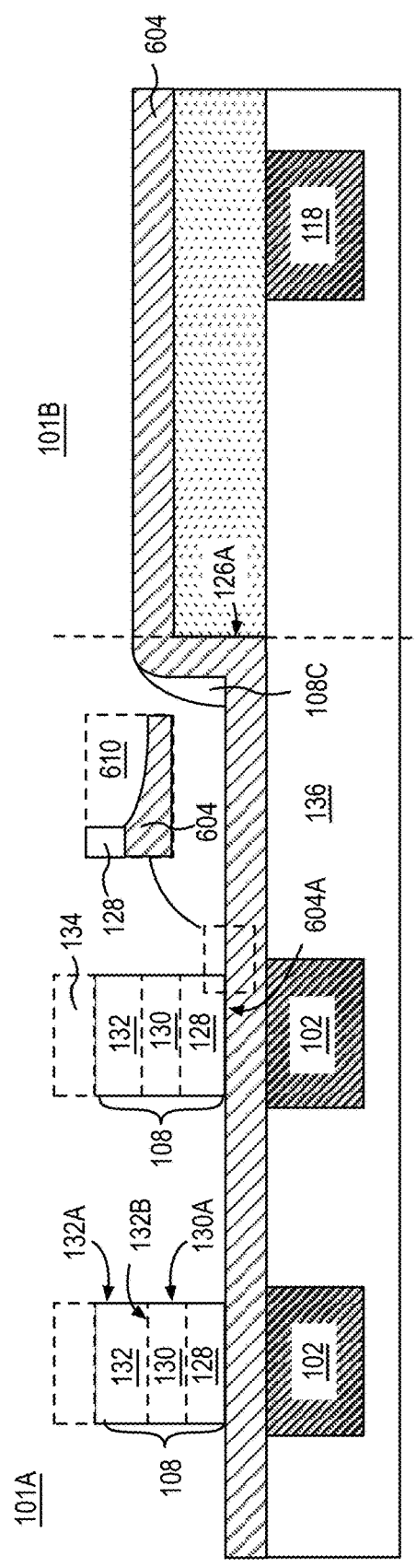
FIG. 6D is a cross-sectional illustration of the structure in FIG. 6C following the process to form ferroelectric memory devices.

FIG. 6D is a cross-sectional illustration of the structure in FIG. 6C following the process to pattern hardmask layer 608. In an embodiment, hardmask layer 608 is etched by a plasma etch process. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9-1e12 ions/$cm^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations. It is highly desirable to pattern hardmask layer 608 to have substantially vertical side walls to prevent increase in the lateral thickness when patterning the remaining layers in material layer stack 606.

A $CH_xF_y$ (fluorocarbon) $O_2$ and Ar based gas combination may be utilized to etch hardmask layer 608 to form hardmask 134 in one of the three different plasma discharges described above. In an exemplary embodiment, hardmask 134 has a substantially vertical profile relative to a lowermost surface 230A. In some embodiments, photo resist mask 609 is removed after forming hardmask 134. The plasma etch process is continued to pattern conductive layer 606C. Hardmask 134 is utilized to pattern conductive layer 606C. In an embodiment, a plasma etch process is utilized to etch the conductive layer 606C to form a top electrode 132. In the illustrative embodiment, top electrode 132 has substantially vertical sidewalls 132A. In other embodiments, sidewalls 132A are not vertical and have a slope that is different from 90° with respect to a normal to lowermost surface 132B. In some embodiments, hardmask 134 is removed during the plasma etch process as shown, when the hardmask 134 includes a dielectric material. The etch process is continued to etch ferroelectric dielectric layer 606B to form etched ferroelectric dielectric layer 130 (herein ferroelectric dielectric layer 130). In other embodiments, sidewalls 130A of the ferroelectric dielectric layer 130 are sloped.

The plasma etch process is continued to pattern and form a bottom electrode 128. In an embodiment, the process utilized to etch conductive layer 606A (FIG. 6C) to form bottom electrode 128 may be substantially the same as the etch process utilized to form top electrode 132. In the illustrative embodiment, sidewalls of the ferroelectric memory device 108 are substantially vertical respect to a normal to uppermost surface 604A. In other embodiments, the sidewalls 108A are not vertical and have a slope that is different from 90° with respect to a normal to uppermost surface 604A. The process of forming the top electrode 132, ferroelectric dielectric layer 234, bottom electrode 128 also completes formation of ferroelectric memory device 108.

In an embodiment, portion 108C including one or more layers in ferroelectric memory device 108 are also left as a spacer adjacent to electrode material 604 that is formed on sidewall 126A. In an embodiment, the electrode material is not etched during the formation of ferroelectric memory devices 108. In other embodiments, electrode material 604 may be recessed relative to uppermost surface 604A, as indicated within enhanced image in box 610.

Figure 6E:
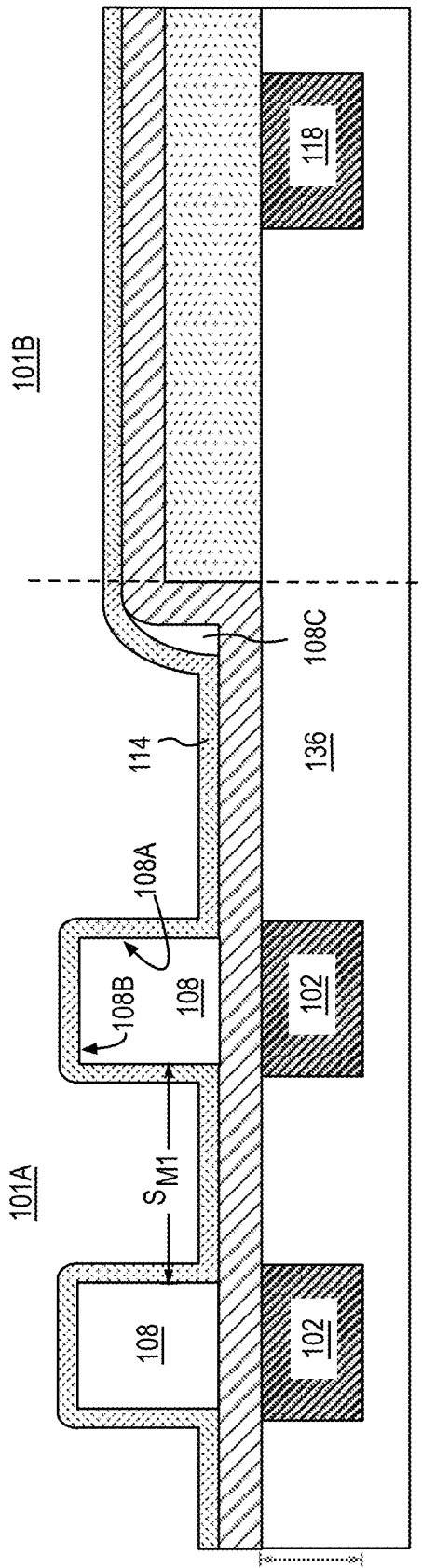
FIG. 6E is a cross-sectional illustration of the structure in FIG. 6D following the process to deposit an encapsulation layer on the ferroelectric memory devices and on the electrode material.

FIG. 6E is a cross-sectional illustration of the structure in FIG. 6D following the process to deposit encapsulation layer 114 on ferroelectric memory devices 108, on portion 108C, and on electrode material 604. In an embodiment, encapsulation layer 114 includes silicon and one or more of carbon, nitrogen and oxygen. Encapsulation layer 114 may be deposited by a PVD, PECVD or an ALD process. The deposition process may be conformal on uppermost surface 108B and on sidewall 108A of ferroelectric memory devices 108. In other embodiments, etch stop layer 126 may be wider adjacent to uppermost surface 108B and narrower at the base of ferroelectric memory device 108. Encapsulation layer 114 may be deposited to a thickness, $T_{EC}$, between 5 nm and 30 nm. The thickness, $T_{EC}$, depends on a maximum spacing, $S_{M1}$, between adjacent ferroelectric memory devices 108.

In some embodiments, when the electrode material 604 is recessed (such as is shown in the box 610 in FIG. 6E), the encapsulation layer 114 is deposited on an etched surface of the electrode material 604. In some such embodiments, encapsulation layer 114 is deposited below a lowermost surface of the ferroelectric memory device 108.

Figure 6F:
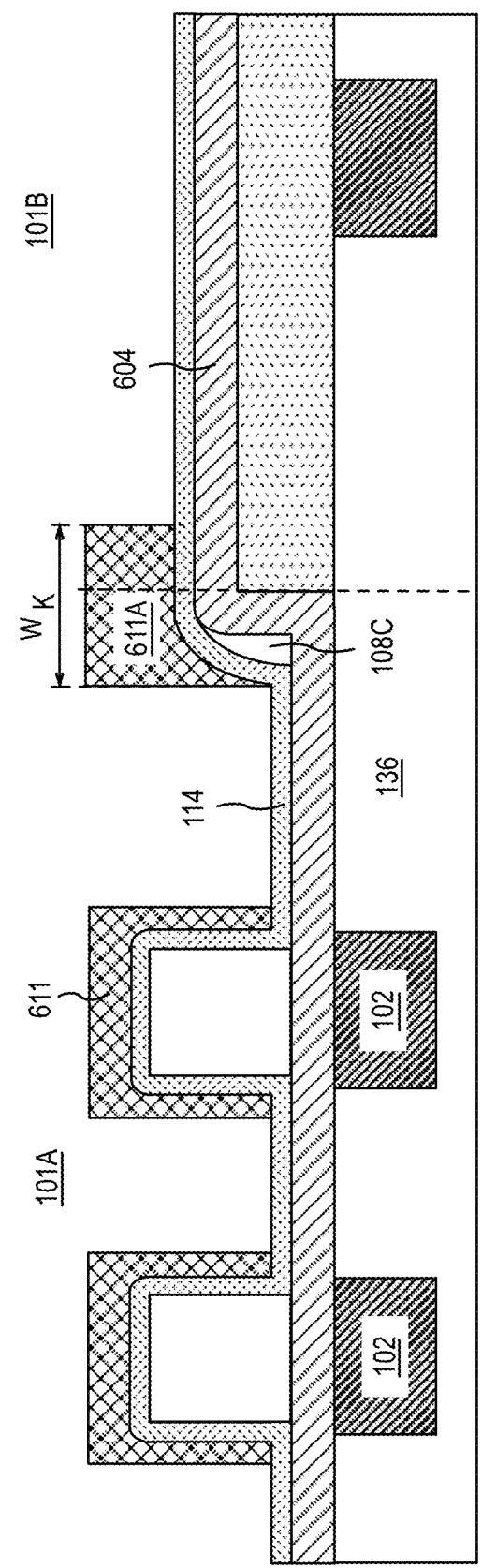
FIG. 6F is a cross-sectional illustration of the structure in FIG. 6E following the process to form a block mask on the encapsulation layer to isolate each ferroelectric memory device.
Figure 7A:
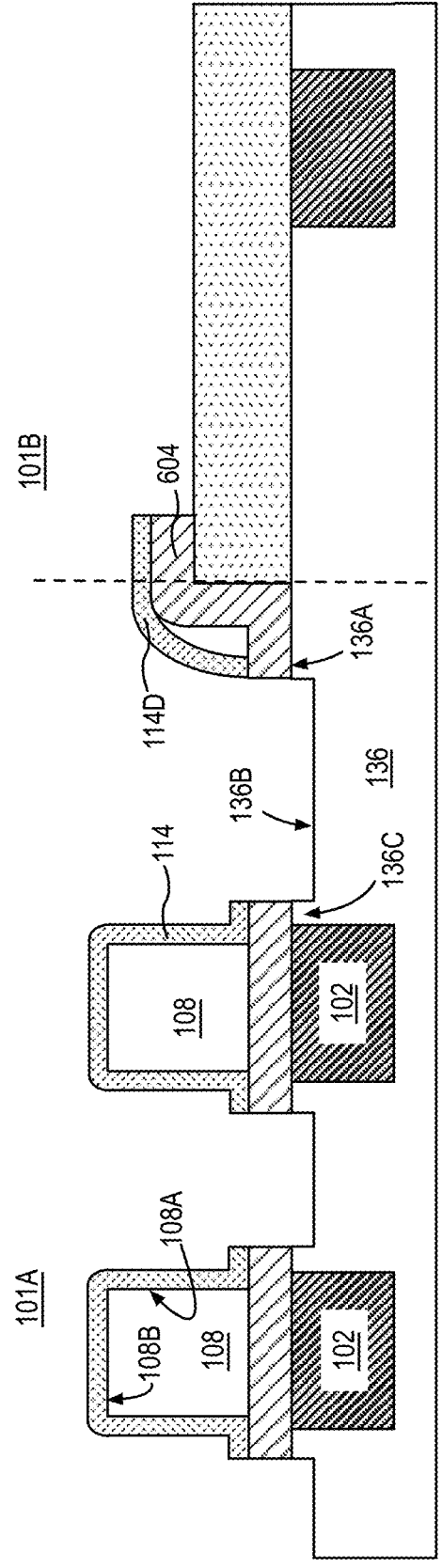
FIG. 7A is a cross-sectional illustration of the structure in FIG. 6H following the process to etch the electrode material to form isolated ferroelectric memory devices.

FIG. 6F is a cross-sectional illustration of the structure in FIG. 6E following the process to form mask 611 on encapsulation layer 114 to isolate each ferroelectric memory device 108. As shown in FIG. 7A, mask 611 includes mask portion 611A at the interface between memory region 101A and logic region 101B. In an embodiment, mask 611 is formed by a lithographic process and includes a photoresist material. Mask portion 611A may be wider or narrower than depicted. In exemplary embodiments mask portion 611A may have a width, $W_K$, that is sufficiently narrow to remove portion 108C.

It is to be appreciated that mask 611 may not be perfectly symmetric about each ferroelectric memory device 108. Mask 611 that is asymmetric may cause lateral portions of encapsulation layer 114 (on dielectric 136) to be disproportionate about sidewalls 108A. For example, some lateral portions of encapsulation layer 114 maybe wider than others. However, a level of disproportionality in the lateral portions may be substantially the same across each ferroelectric memory device 108 in the memory region (due to uniform misalignment). Such disproportionality is not expected to result in degradation in device performance.

Figure 6G:
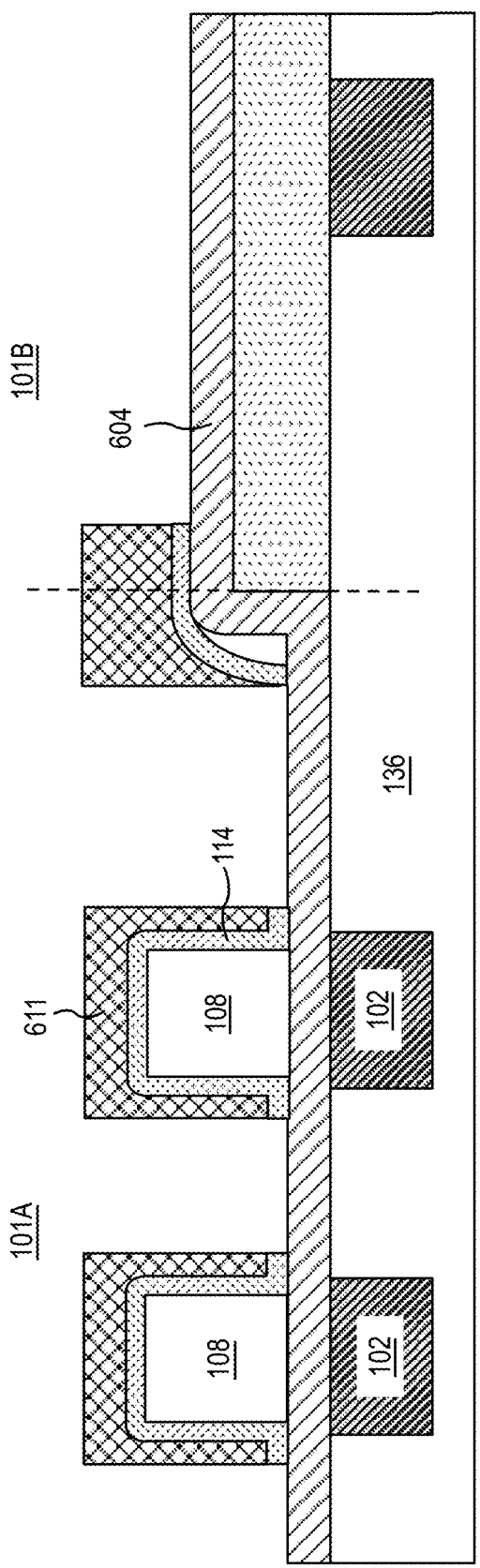
FIG. 6G is a cross-sectional illustration of the structure in FIG. 6H following the process to etch the encapsulation layer.

FIG. 6G is a cross-sectional illustration of the structure in FIG. 6H following the process to etch encapsulation layer 114. In an embodiment, a plasma etch process is utilized to etch encapsulation layer 114 selective to electrode material 604.

FIG. 7A is a cross-sectional illustration of the structure in FIG. 6H following the process to etch electrode material 604 to form isolated ferroelectric memory devices 108 and electrode structure 112 below each ferroelectric memory device 108. In an embodiment, a plasma etch process is utilized to etch electrode material 604. In an embodiment, a portion of dielectric 136 is also etched as shown. In the illustrative embodiment, dielectric surface 136B is recessed relative to an uppermost dielectric surface 136A while etching the electrode material 604. In some such embodiments, dielectric portion 136C is adjacent to conductive interconnect 102. Dielectric portion 136C surrounds conductive interconnect 102. In embodiments, the recess may range from 2 nm to 10 nm. Encapsulation layer 114 is not removed from masked areas such as from sidewalls 108A and top surfaces 108B of the ferroelectric memory devices 108.

Figure 7B:
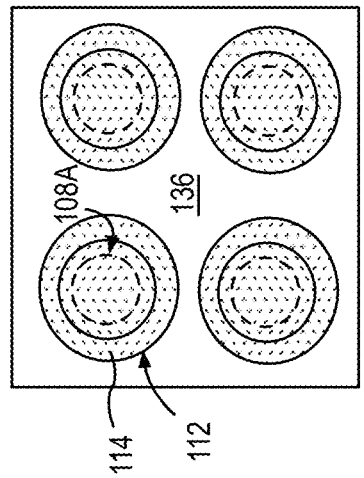
FIG. 7B is a plan-view illustration of the structure in FIG. 7A, in an embodiment where conductive interconnects are discrete islands, and the block mask forms a substantially circular encapsulation layer around a sidewall of each ferroelectric memory devices.

FIG. 7B is a plan-view illustration of the structure in FIG. 7A, in an embodiment where the conductive interconnects 102 are discrete islands and the mask forms a substantially circular encapsulation layer around sidewalls 108A of ferroelectric memory device 108.

A plan view profile of an electrode structure 112 can be independent of a plan view profile of the ferroelectric memory device 108, as the mask utilized to form electrode structure 112 is designed independently of the mask utilized to pattern to form ferroelectric memory devices 108.

Figure 7C:
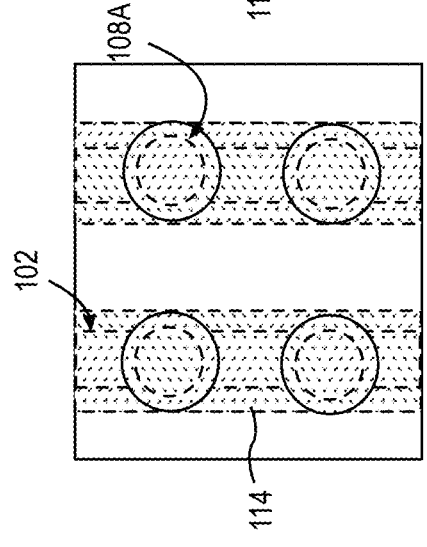
FIG. 7C is a plan-view illustration of the structure in FIG. 7A, in an embodiment where the conductive interconnects are trenches and the mask forms an encapsulation layer around sidewall of each ferroelectric memory device.

FIG. 7C is a plan-view illustration of the structure in FIG. 7A, in an embodiment where conductive interconnects 102 are trenches and the mask forms encapsulation layer 114 around sidewalls 108A of ferroelectric memory device 108. As shown, encapsulation layer 114 also extends parallel to conductive trench interconnects 102 and resembles the structure depicted in FIG. 3A.

Figure 7D:
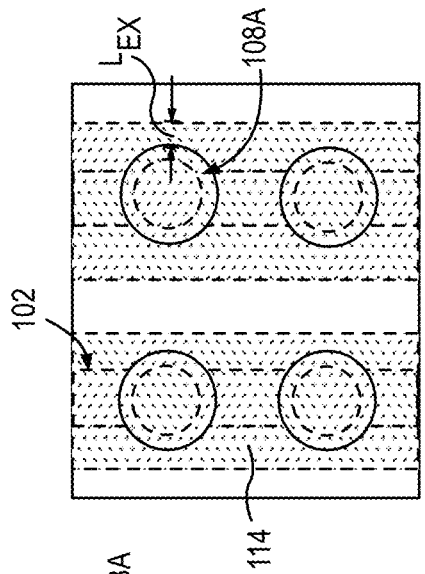
FIG. 7D is a plan-view illustration of the structure in FIG. 7A, in an embodiment where the conductive interconnects are trenches and the mask forms an encapsulation layer around sidewall of each ferroelectric memory device.

FIG. 7D is a plan-view illustration of the structure in FIG. 7A, in an embodiment where conductive interconnects 102 are trenches and the mask forms encapsulation layer 114 around sidewalls 108A of ferroelectric memory device 108. As shown, the encapsulation layer 114 also extends parallel to the conductive trench interconnects 102, has a lateral extension $L_{EX}$, and resembles the structure depicted in FIG. 3A.

Figure 8A:
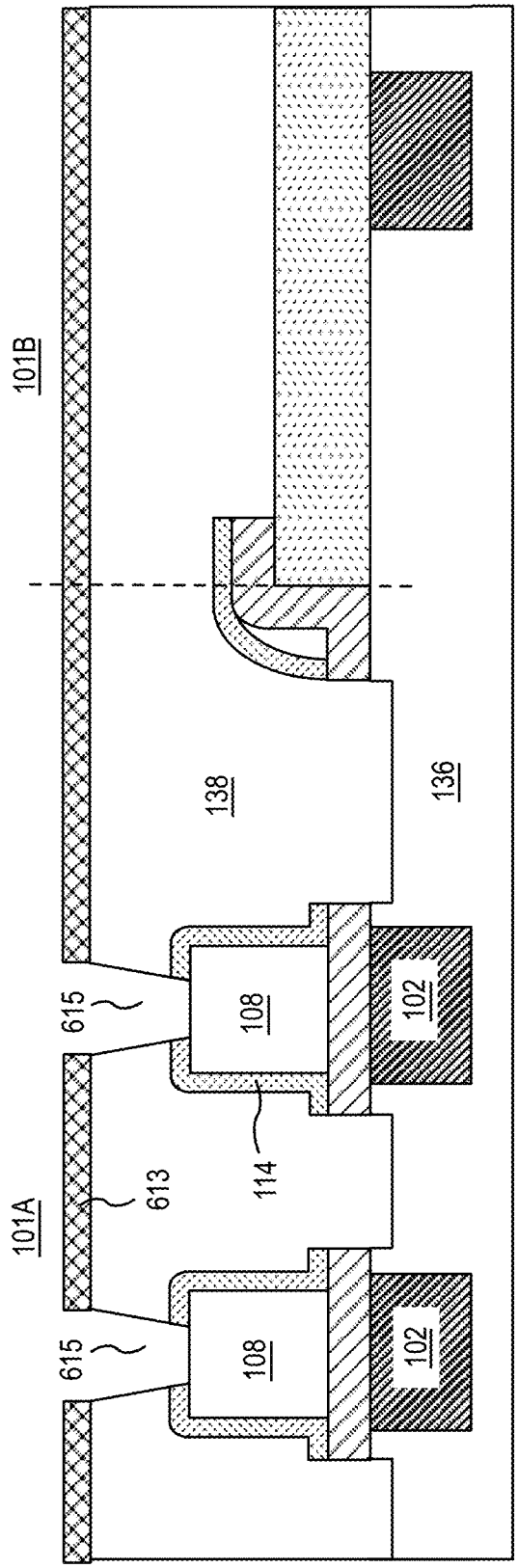
FIG. 8A is a cross-sectional illustration of the structure in FIG. 7A following the process to form openings in a second dielectric formed above the ferroelectric memory devices.

FIG. 8A is a cross-sectional illustration of the structure in FIG. 7A following the process to form openings in a dielectric formed above ferroelectric memory devices 108. In an embodiment, a blanket deposition process is utilized to deposit dielectric 138 on encapsulation layer 114, on dielectric 136 and on etch stop layer 126. The deposition process may be carried out by a PVD, PECVD, atomic layer deposition (ALD) or a chemical vapor deposition (CVD) process. Dielectric 138 may be planarized after deposition. Mask 613 may be formed on the dielectric 138 by a lithographic process. In an embodiment, openings 615 may be formed in the dielectric by a plasma etch process. The plasma etch process is utilized to etch the encapsulation layer selectively to an uppermost layer of the ferroelectric memory device 108 in openings 615. In the illustrative embodiment, the openings are tapered. In other embodiments, openings 615 are substantially vertical.

Figure 8B:
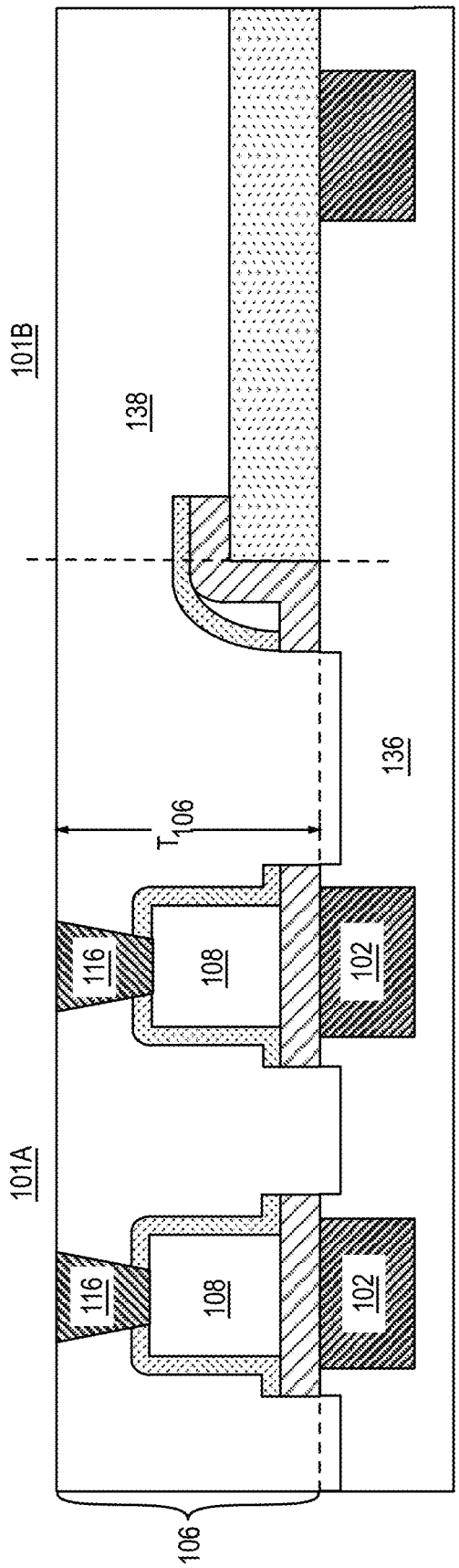
FIG. 8B is a cross-sectional illustration of the structure in FIG. 8A following the process to remove the mask and deposit a conductive material to form via electrodes.

FIG. 8B is a cross-sectional illustration of the structure in FIG. 8A following the process to remove the mask 613 and deposit a conductive material to form via electrodes 116. In an embodiment, one or more liner layers are formed in opening 615 on the uppermost layer of ferroelectric memory device 108. In some embodiments, a fill metal such as copper, tungsten, nickel, cobalt is deposited on a liner layer. The liner layer may include ruthenium or tantalum. A planarization process may be performed to remove the excess conductive material deposited on dielectric 138. In an embodiment, the planarization process includes a chemical mechanical polish (CMP) process. Dielectric 138 has a thickness that is approximately equal to the vertical thickness, $T_{106}$ of level 106.

Figure 8C:
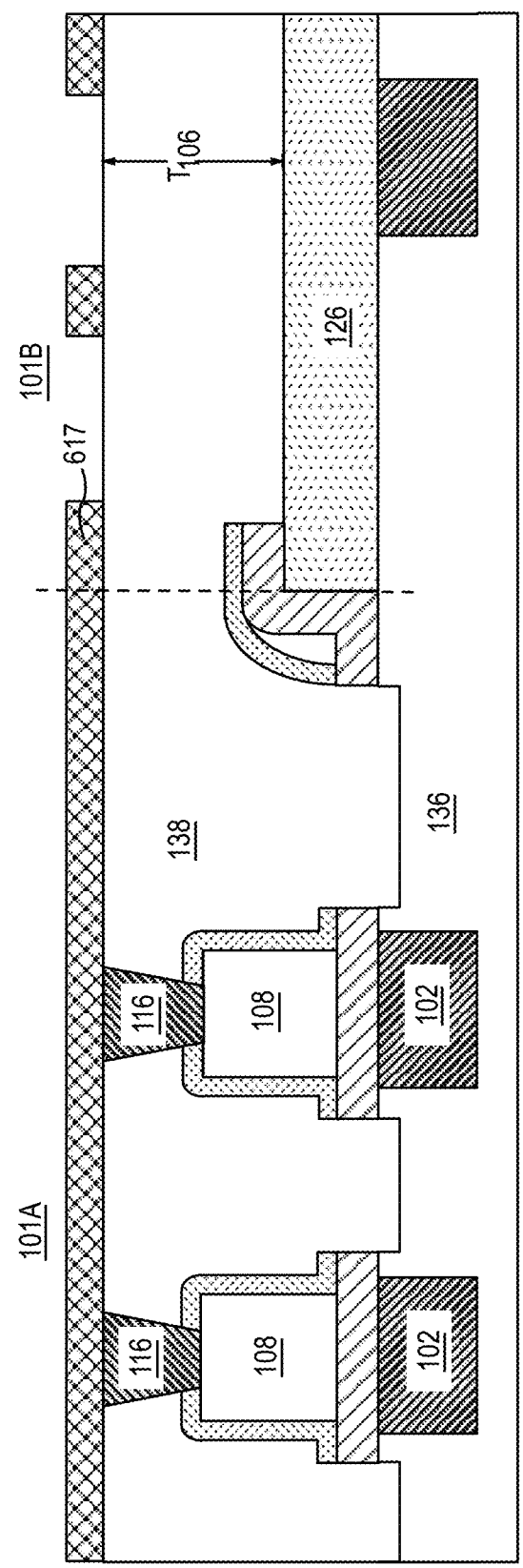
FIG. 8C is a cross-sectional illustration of the structure in FIG. 8B following the process to form a mask on the second dielectric, and on the via electrodes.

FIG. 8C is a cross-sectional illustration of the structure in FIG. 8B following the process to form mask 617 on dielectric 138, and on the via electrodes 116. Mask 617 is designed to form an interconnect structure in logic region 101B. In an embodiment, mask 617 is formed by a lithographic process and includes a photoresist material.

FIG. 8D is a cross-sectional illustration of the structure in FIG. 8C following the process to etch dielectric 138 to form hanging trench openings 619A and 619B in logic region 101B. In an embodiment, a plasma etch process is utilized to etch dielectric 138 through openings in mask 617 to form trench openings 619A, and 619B. Dielectric 138 may be etched to a depth, $T_H$ and a width, $W_H$, that is determined by a thickness $T_O$, of dielectric 138 above the etch stop layer 126. In embodiments, $T_H$ and $W_H$ range between 10 nm and 200 nm and between 10 nm and 50 nm, respectively. $W_H$ is determined by a width of interconnect vias to be formed within the trench. A height, difference between $T_O$ and $T_H$, of the remaining dielectric 138 (as measured from an uppermost surface of etch stop layer 126) may also be determined by a height and width of a via to be formed within trench opening 619B. The height and width of a via is determined by a desired minimum line conductance of the via to be formed within trench opening 619B.

FIG. 8E is a cross-sectional illustration of the structure in FIG. 8D following the process to etch dielectric 138 to form a via within in the hanging trench in logic region 101B. In an embodiment, mask utilized to form trench openings 619A and 619B is removed and a new mask 621 is formed. In an embodiment, mask 621 is formed by a lithographic process and includes a photoresist material. Mask 621 has an opening within trench opening 619A that is designed to enable etching the dielectric 138 to form a via opening 619C as shown. In the illustrative embodiment, mask 621 does not include an opening within trench opening 619A in the plane of the Figure but may include an opening in a plane that is behind or in front. In an embodiment, a plasma etch process is utilized to form via opening 619C by etching the dielectric 138 and etch stop layer 126. An advantage of the process methodology outlined herein, is that etch stop layer 126 has a thickness $T_{EC}$, that is determined by a deposition process and is unaltered by the formation of electrode structure 112 in memory region 101A. Formation of via opening 619B within stop layer 126 can be targeted and tuned by depositing the etch stop layer 126 to a desired thickness. In the illustrative embodiment, the formation of via opening 619B exposes an uppermost surface 118A of conductive interconnect 118.

Figure 8F:
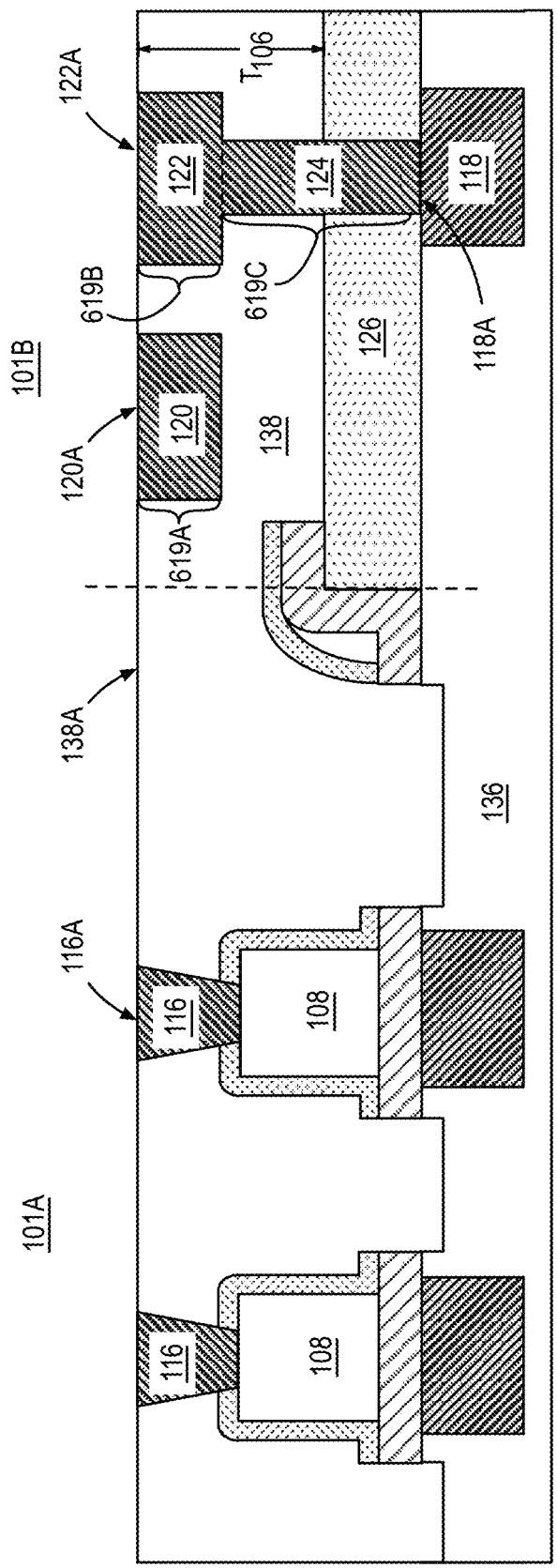
FIG. 8F is a cross-sectional illustration of the structure in FIG. 8E following the process to remove the mask and deposit a conductive material into the hanging trench and the opening to form via and metal lines.

FIG. 8F is a cross-sectional illustration of the structure in FIG. 8E following the process to remove the mask and deposit a conductive material into the openings to form via 124, and metal lines 120 and 122. Mask utilized to form via opening 619B is removed and a conductive material is deposited into the trench openings 619A, 619B and via opening 619B. In an embodiment, the conductive material includes a material that is the same or substantially the same as the material of the via electrode 116, including embodiments with or without one or more liner layers and fill metal. In some embodiments, a fill metal includes copper, tungsten, nickel or cobalt, and a liner layer includes ruthenium or tantalum. In some such embodiments, the liner layer is deposited on uppermost surface 118A of the conductive interconnect 118, on sidewalls of etch stop layer 126, dielectric 138, on uppermost dielectric surface 138A and on surfaces of via electrodes 116. In other embodiments where no liner is implemented a fill metal or a conductive material is directly deposited on uppermost surface 118A of the conductive interconnect 118, on sidewalls of etch stop layer 126, dielectric 138, on uppermost dielectric surface 138A and on surfaces of via electrodes 116.

A planarization process may be utilized to remove an excess conductive material deposited on dielectric 138 and on via electrodes 116. In an embodiment, the planarization process includes a chemical mechanical polish (CMP) process. The CMP process isolates metal line 120 from metal line 122. Via 124 is formed at the same time as metal line 122.

In the illustrative embodiment, uppermost surfaces 116A of via electrode 116 and uppermost surfaces 120A and 122A of metal lines are co-planar or substantially co-planar after the CMP process.

In general, via electrodes 116 may be fabricated before or after fabrication of via 124 and metal line 122. The method described in association with FIGS. 8A-F can be performed so as to fabricate via 124 and metal line 122 prior to fabrication of via electrodes 116.

In other embodiments, such as is illustrated in FIG. 16A, opening 615, and trench openings 619A and 619B can be formed simultaneously. In some such embodiments, openings 615, and trench openings 619A and 619B can have a substantially same depth $D_H$ as shown. $D_H$ is less than a total depth $T_O$ of the dielectric 138, as shown. Trench openings 619A and 619B have a width, $W_H$. $W_H$ can be the same or different for trench openings 619A and 619B. In an embodiment, a first plasma etch is utilized to etch dielectric 138 selective to encapsulation layer 114, and a second plasma etch that is selective to dielectric 138 is utilized to etch encapsulation layer 114. In some embodiments, depending on thicknesses of dielectric 138 and encapsulation layer 114, $D_H$ in the logic region 101B can be greater by up to 5% compared to $D_H$ in the memory region 101A.

The process can be continued to form mask 621 that covers openings 615 and portions of trench openings 619A and 619B, as shown in FIG. 16B. A plasma etch process described in association with FIG. 8E may be performed to form opening 619C. The plasma etch etches an entire thickness $T_{EC}$ and exposes uppermost surface 118A. In some embodiments, remove mask 621 can be removed after formation of openings 615, and trench openings 619A and 619B as shown in FIG. 16C.

The process can be continued to fill openings 616, 619A, 619B and 619C as shown in FIG. 16D. The process to fill openings 615, and trench openings 619A and 619B and form via electrodes 116, via 124 and metal lines 120 and 122 is the same or substantially the same as the method described in association with FIG. 8F.

FIG. 9A is a cross-sectional illustration of the structure in FIG. 6F, following a process to etch encapsulation layer 114, to remove or reduce a thickness of portion 108C. In the illustrative embodiment, mask portion 611A (dashed box) has been removed to facilitate easier removal of encapsulation layer 114 from above stack portion 108C and for removal of stack portion 108C and electrode material 604 in a subsequent processing operation. In the illustrative embodiment, a plasma etch is utilized to etch encapsulation layer 114 selectively to the electrode material 604.

FIG. 9B is a cross-sectional illustration of the structure in FIG. 9A following the process to etch and remove electrode material 604 to form ferroelectric memory devices 108. In an embodiment, a plasma etch described in association with FIG. 7A is utilized to etch the electrode material 604. In the illustrative embodiment, electrode material 604 remains adjacent to encapsulation layer sidewall 126A but is not on an uppermost surface of etch stop layer 126. Also as shown, the stack portion 108C is reduced in size. In other embodiments, an opening may be made within the vicinity of the sidewall 126A to preferentially remove stack portion 108C and electrode material 604 adjacent to the encapsulation layer sidewall 126A.

Figure 10:
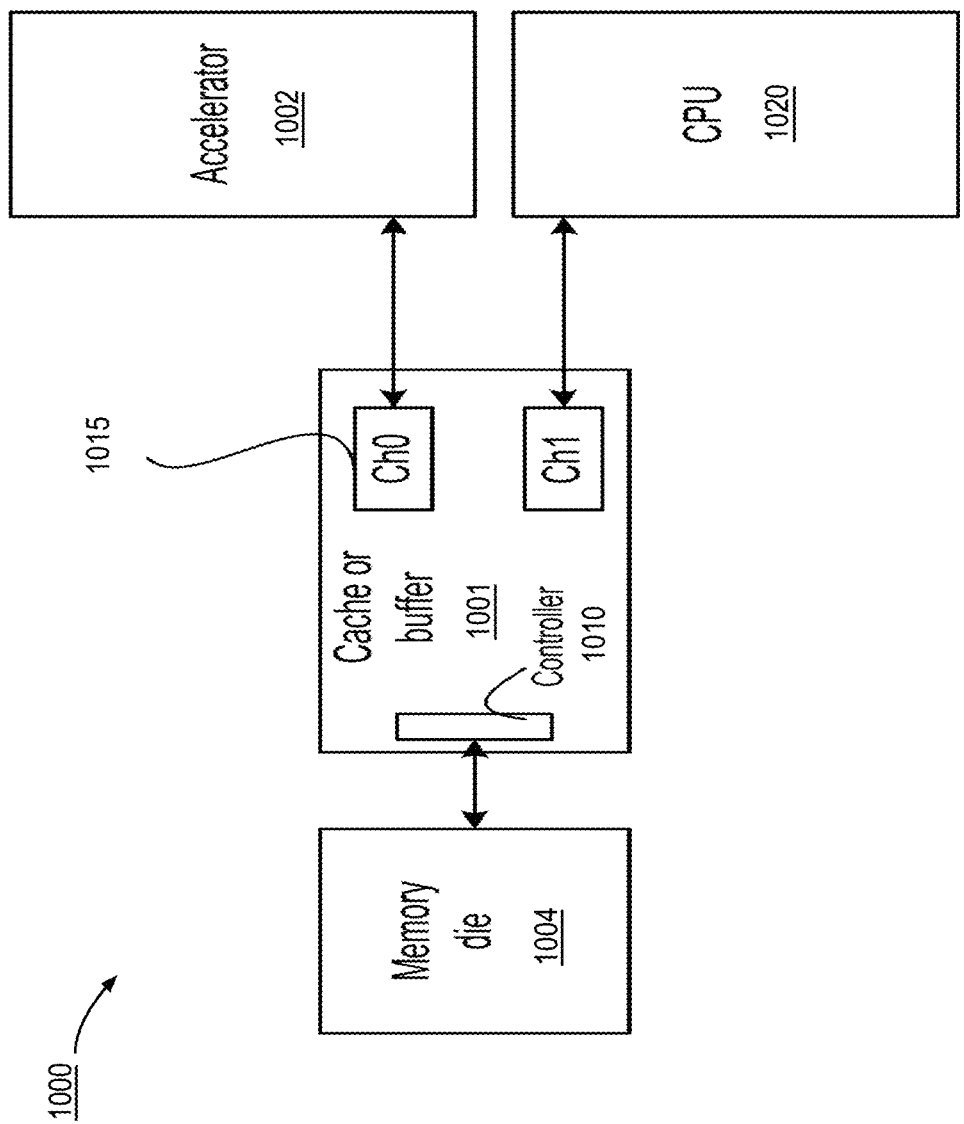
FIG. 10 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 10 illustrates computing architecture 1000 with a coherent cache or memory-side buffer chiplet that includes a memory controller, wherein the coherent cache or memory-side buffer chiplet is coupled to an accelerator, a processor, and a memory, in accordance with some embodiments. Computing architecture 1000 comprises coherent cache or memory-side buffer chiplet 1001, accelerator 1002 (e.g., inference chip), processor 1020 (e.g., central processing unit), and memory die 1004. In some embodiments, coherent cache or memory-side buffer chiplet 1001 comprises at least two channels 1015 which are configured to connect with accelerator 1002 and processor 1020. In some embodiments, coherent cache or memory-side buffer chiplet 1001 comprises I/O and controller 1010 to manage data traffic with memory die 1004. By moving controller 1010 from processor 1020 to coherent cache or memory-side buffer chiplet 1001, cost in terms of power and die area for processor 1020 is reduced. In some embodiments, coherent cache or memory-side buffer chiplet 1001 is a cache memory that comprises ferroelectric memory cells. For example, coherent cache or memory-side buffer chiplet 1001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 11:
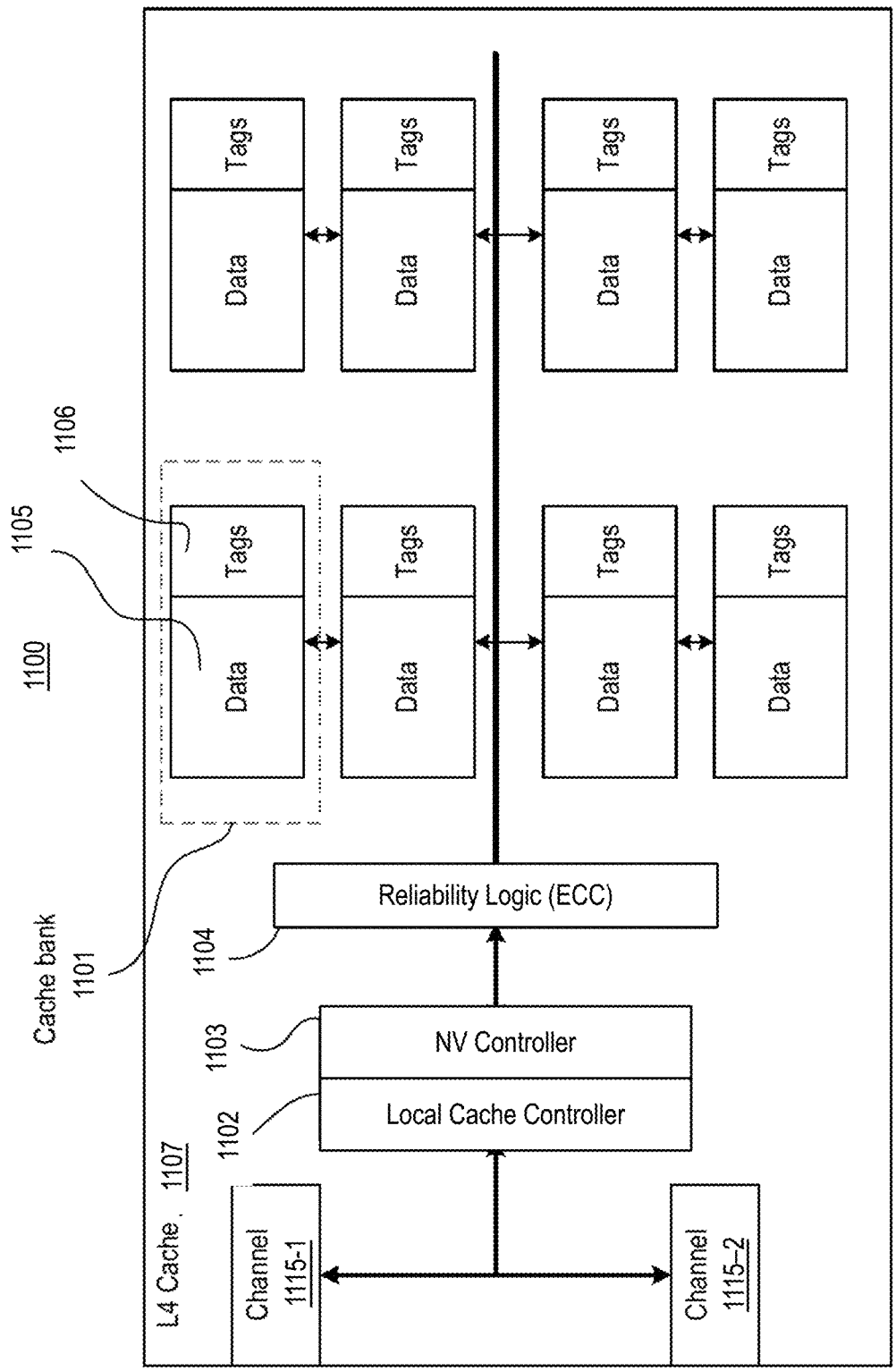
FIG. 11 illustrates an architecture of the coherent cache or memory-side buffer chiplet with multiple controllers and multiple cache banks, in accordance with some embodiments.

FIG. 11 illustrates architecture 1100 of the coherent cache or memory-side buffer chiplet (e.g., 1107) with multiple controllers and multiple cache banks, in accordance with some embodiments. In some embodiments, architecture 1100 comprises channels (e.g., ch0 1115-1 and ch1 1115-2), cache banks 1101, local cache controller 1102, non-volatile (NV) controller 1103, and reliability logic 1104. Coherent cache or memory-side buffer chiplet 1107 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 1101 includes data bank 1105 (e.g., comprising memory cells) and associated tags 1106. In some embodiments, data bank 1105 comprises ferroelectric memory cells. In some embodiments, data bank 1105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 1105 includes ferroelectric memory, it uses NV controller 1103 and a stronger reliability logic (e.g., error correction code) for security compared to non-ferroelectric memory for data bank 1105.

When data bank 1105 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tags 1106 may be coupled with each physical line. Tags 1106 may comprise some address bits, sufficient to uniquely identify which address currently occupies the physical line coupled with the tag.

In some embodiments, cache controller 1102 could be used to control state transitions required for cache look ups such as comparing requested addresses with tags stored in the tags 1106 and identifying a candidate for replacement (replacement algorithm) when a cache miss occurs. In addition, the cache controller could be tasked with initializing the cache when the cache powers on. When FE memory of data bank 1105, which retains state across power cycles, is used, cache controller 1102 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 1102 would skip locations marked thus when initializing memory.

In some embodiments, reliability logic 1104 performs error correction to the data. Any suitable error correction scheme (e.g., with error correction code (ECC)) may be used by reliability logic 1104. In some embodiments, NV controller 1103 is provided to explicitly clear the cache when using a non-volatile memory, such as FM memory for data bank 1105. NV controller 1103 may include an NV bit which indicates cache lines that should not be cleared but are expected to retain their contents across power cycles. The functions of NV controller 1103 can be combined in cache controller 1102, or vice versa.

Figure 12:
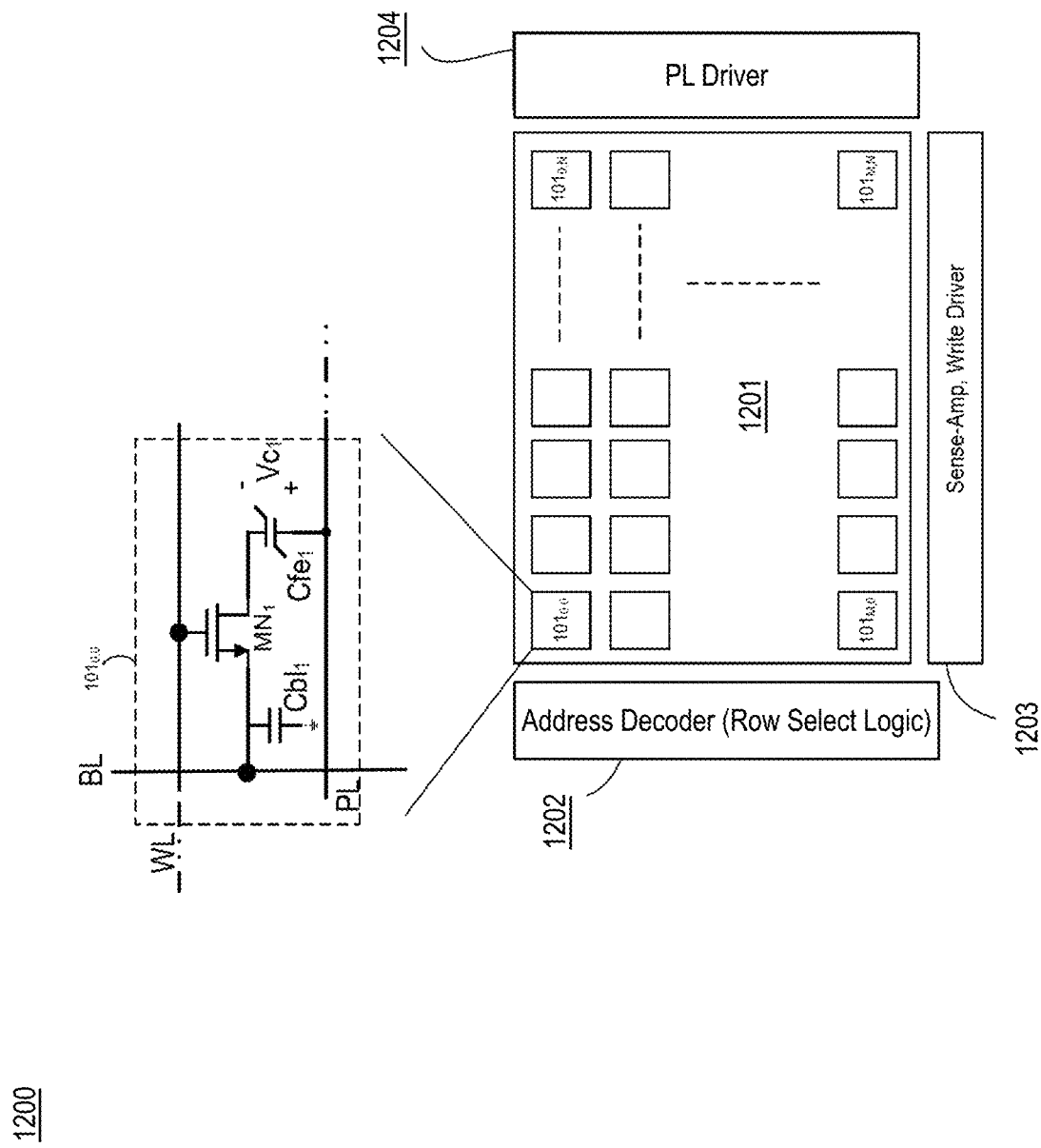
FIG. 12 illustrates an apparatus comprising memory and corresponding logic, wherein the memory comprises ferroelectric (FE) memory bit-cells, in accordance with some embodiments.

FIG. 12 illustrates apparatus 1200 comprising memory and corresponding logic, wherein the memory comprises ferroelectric (FE) memory bit-cells, in accordance with some embodiments. Apparatus 1200 comprises M×N memory array 1201 of bit-cells, logic circuitry 1202 for address decoding, sense amplifier and write drivers 1203, and plate-line (PL) driver 1204. Logic circuitry 1202 comprises address decoders for selecting a row of bit-cells and/or a particular bit-cell from M×N memory array 1201, where M and N are integers of same or different values. Write drivers 1203 comprises sense-amplifiers for reading the values from the selected bit-cell, while write drivers 1203 are used to write a particular value to a selected bit-cell. Here, a schematic of FE bit-cell $1201_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $1201_{0,0}$ comprises a word-line (WL), a plate-line (PL), a bit-line (BL), a complementary bit-line (BLB), and two half bit-cells $1201_{0,0\_A}$ and $1201_{0,0\_B}$. In some embodiments, bit-cell $1201_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_1$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 13:
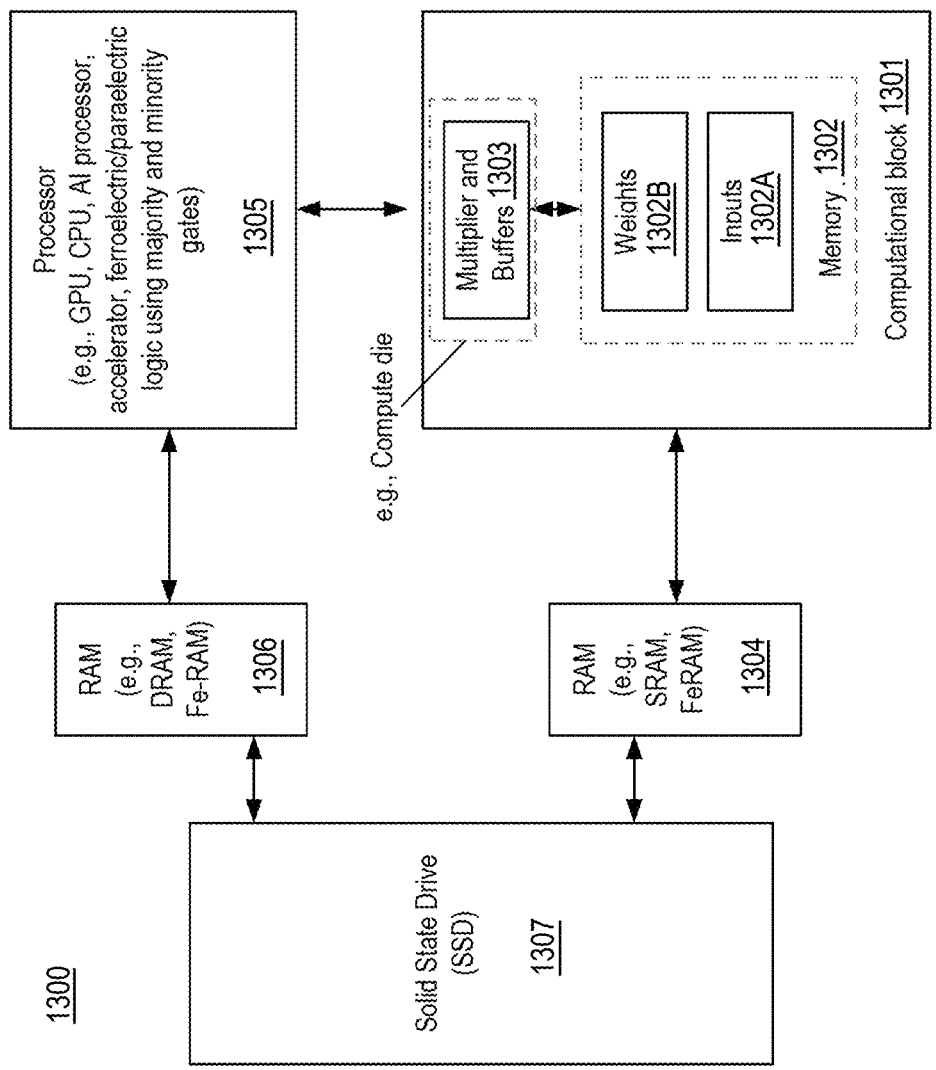
FIG. 13 illustrates a high-level architecture of an artificial intelligence (AI) machine comprising a compute die positioned on top of a memory die, in accordance with some embodiments.

FIG. 13 illustrates a high-level architecture of an artificial intelligence (AI) machine 1300 comprising a compute die positioned on top of a memory die, in accordance with some embodiments. AI machine 1300 comprises computational block 1301 or processor having random-access memory (RAM) 1302 and compute die 1303; first random-access memory (RAM) 1304 (e.g., static RAM (SRAM), ferroelectric or paraelectric RAM (FeRAM), ferroelectric or paraelectric static random-access memory (FeSRAM)), processor 1305, second random-access memory (RAM) 1306 (dynamic RAM (DRAM), FeRAM), and solid-state memory or drive (SSD) 1307. In some embodiments, some or all components of AI machine 1300 are packaged in a single package forming a system-on-chip (SoC). The SoC can be configured as a logic-on-logic configuration, which can be in a 3D configuration or a 2.5D configuration.

In some embodiments, computational block 1301 is packaged in a single package and then coupled to processor 1305 and RAM 1304, 1306, and SSD 1307 on a printed circuit board (PCB). In some embodiments, computational block 1301 is configured as a logic-on-logic configuration, which can be in a 3D configuration or a 2.5D configuration. In some embodiments, computational block 1301 comprises a special purpose compute die 1303 or microprocessor. For example, compute die 1303 is a compute chiplet that performs a function of an accelerator or inference. In some embodiments, RAM 1302 is DRAM which forms a special memory/cache for the special purpose compute die 1303. The DRAM can be embedded DRAM (eDRAM) such as 1T-1C (one transistor and one capacitor) based memories. In some embodiments, RAM 1302 is ferroelectric or paraelectric RAM (Fe-RAM).

In some embodiments, compute die 1303 is specialized for applications such as Artificial Intelligence, graph processing, and algorithms for data processing. In some embodiments, compute die 1303 further has logic computational blocks, for example, for multipliers and buffers, a special data memory block (e.g., buffers) comprising DRAM, FRAM, or a combination of them. In some embodiments, RAM 1302 has weights and inputs stored in-order to improve the computational efficiency. The interconnects between processor 1305 (also referred to as special purpose processor), first RAM 1304 and compute die 1303 are optimized for high bandwidth and low latency. The architecture of FIG. 13 allows efficient packaging to lower the energy, power, or cost and provides for ultra-high bandwidth between RAM 1302 and compute die 1303 of computational 1301.

In some embodiments, RAM 1302 is partitioned to store input data (or data to be processed) 1302a and weights 1302b. In some embodiments, input data 1302a is stored in a separate memory (e.g., a separate memory die) and weights 1302b are stored in a separate memory (e.g., separate memory die).

In some embodiments, computational logic or compute chiplet 1303 comprises matrix multiplier, adder, concatenation logic, buffers, and combinational logic. In various embodiments, compute die 1303 performs multiplication operation on input data 1302a and weights 1302b. In some embodiments, weights 1302b are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in RAM 1302. In various embodiments, the input data, that is to be analyzed using a trained model, is processed by computational block 1301 with computed weights 1302b to generate an output (e.g., a classification result).

In some embodiments, first RAM 1304 is ferroelectric or paraelectric based SRAM. For example, a six transistor (6T) SRAM bit-cells having ferroelectric or paraelectric transistors are used to implement a non-volatile FeSRAM. In some embodiments, SSD 1307 comprises NAND flash cells. In some embodiments, SSD 1307 comprises NOR flash cells. In some embodiments, SSD 1307 comprises multi-threshold NAND flash cells.

In various embodiments, the non-volatility of FeRAM is used to introduce new features such as security, functional safety, and faster reboot time of AI machine 1300. The non-volatile FeRAM is a low power RAM that provides fast access to data and weights. FeRAM can also serve as a fast storage for inference die 1301 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 1300 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO$_3$a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-$RMnO3$, where R is a rare earth element viz. cerium (Ce), dysprosium (Dy), erbium (Er), curopium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO5$ polyhedra, accompanied by displacements of the Y ions, which lead to a net electric polarization. In some embodiments, hexagonal FE includes one of: $YMnO_3$ or $LuFcO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 213. Perovskites can be suitably doped to achieve a spontaneous distortion in a range of 0.3 to 2%. For chemically substituted $BiFeO_3$, $BrCrO_3$, $BuCoO_3$ class of materials, La or rate earth substitution into the Bi site can tune the spontaneous distortion. In some embodiments, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as $SrRuO_3$ coated on top of $IrO_2$, $RuO_2$, $PdO_2$, $PtO_2$, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: $SrTiO_3$, $Ba_{(x)}Sr_{(y)}TiO_3$ (where x is −0.05, and y is 0.95), $HfZrO_2$, Hf—Si—O.

In some embodiments, the FE material comprises one or more of: hafnium (Hf), zirconium (Zr), aluminum (Al), silicon (Si), their oxides or their alloyed oxides. In some embodiments, the FE material includes one or more of: $Al_{(1-x)}Sc_{(x)}N$, $Ga_{(1-x)}Sc_{(x)}N$, $Al_{(1-x)}Y_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction. In some embodiments, the FE material includes one or more of: Bismuth ferrite or BFO with doping material.

In some embodiments, the FE material includes bismuth ferrite or BFO with a doping material wherein the doping material is one of Lanthanum, or any element from the lanthanide series of the periodic table. In some embodiments, the FE material includes a relaxor ferro-electric includes one of barium titanium-bismuth zinc niobium tantalum (BT-BZNT) or barium titanium-barium strontium titanium (BT-BST).

In some embodiments, the FE material includes hafnium oxides of the form, $Hf_{1-x}E_x$ Oy where E can be Al, Ca, Ce, Dy, Er, Gd, Ge, La, Sc, Si, Sr, Sn, or Y. In some embodiments, the FE material includes Niobate type compounds $LiNbO_3$, $LiTaO_3$, lithium iron tantalum oxy fluoride, barium strontium niobate, sodium barium niobate, or potassium strontium niobate.

In some embodiments, the FE material comprises multiple layers. For example, alternating layers of $[Bi_2O_2]2+$, and pseudo-perovskite blocks ($Bi_4Ti_3O_{12}$ and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-$RMnO_3$, where R is a rare earth element viz. cerium (Ce), dysprosium (Dy), erbium (Er), curopium (Eu), gadolinium (Gd), holmium (Ho), lanthanum (La), lutetium (Lu), neodymium (Nd), prascodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFcO_3$. In various embodiments, when the FE material comprises hexagonal ferroelectrics, the conductive oxides are of $A_2O_3$ (e.g., $In_2O_3$, $Fe_2O_3$) and $ABO_3$type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $SnTiO_3$ (STO), respectively, and $LaAlO_3$ (LAO) and STO, respectively. For example, a super lattice of [PTO/STO]n or [LAO/STO]n, where 'n' is between 1 to 1300. While various embodiments here are described with reference to ferroelectric material for storing the charge state, the embodiments are also applicable for paraelectric material. In some embodiments, paraelectric material includes one of: $SrTiO_3$, $Ba_{(x)}Sr_{(y)}TiO_3$ (where x is −0.5, and y is 0.95), $HfZrO_2$, Hf—Si—O.

The method of forming the structures described herein are applicable to various logic embodiments. For example, the FeRAM devices or capacitive structures formed herein can be used to forming other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Figure 14:
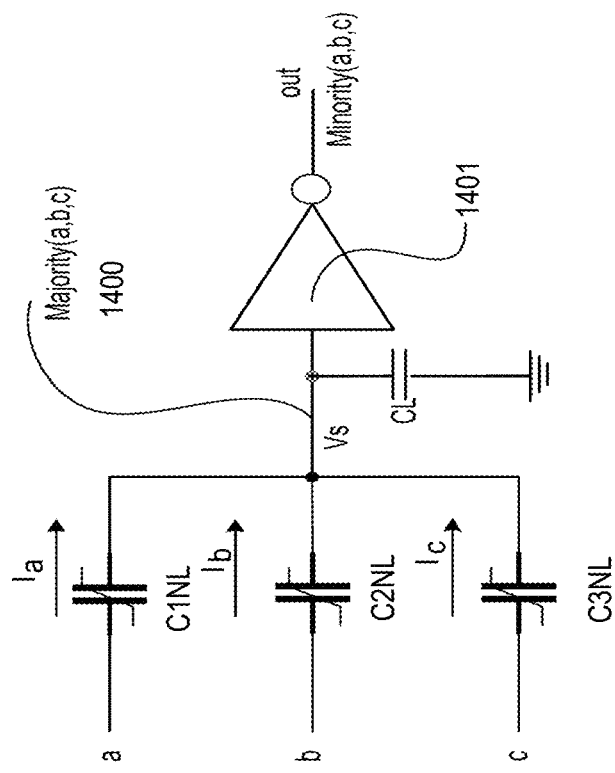
FIG. 14 illustrates a 3-input majority gate using non-linear input capacitors, in accordance with some embodiments.

FIG. 14 illustrates 3-input majority gate 1400 using non-linear input capacitors, in accordance with some embodiments. In some embodiments, 3-input majority gate 1400 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 1400 comprises a driver circuitry 1401. In this example, driver circuitry 1401 is an inverter. In other embodiments, other types of driver circuitries can be used such as NAND gate, NOR gate, multiplexer, buffer, and other logic gates. The majority function is performed at summing node Vs as Majority(a,b,c). In this example, since driver circuitry 1401 is an inverter, minority function is performed at output "out" as Minority(a,b,c).

In some embodiments, in addition to the gate capacitance of driver circuitry 1401, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: $HfO_x$, $ABO_3$ perovskites, nitrides, oxy-fluorides, oxides, etc. A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: $SrTiO_3$, $Ba_{(x)}Sr_{(y)}TiO_3$ (where x is −0.5, and y is 0.95)), $HfZrO_2$, Hf—Si—O, La-substituted $PbTiO_3$, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: $SrTiO_3$, $Ba_{(x)}Sr_{(y)}TiO_3$ (where x is −0.5, and y is 0.95), $HfZrO_2$, Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted $BiFeO_3$, $BiCrO_3$, $BiCrO_3$ class of materials, La or rare earth substitution into the Bi site can tune the spontaneous distortion. In some embodiments, perovskite includes one of: $BaTiO_3$, $KNbO_3$, or $NaTaO_3$.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, $LaNiO_3$ and $ReO_3$.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides adjacent to the FE material are of $A_2O_3$ (e.g., $In_2O_3$, $Fe_2O_3$) and $AB_2O_3$ type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are $LuFcO_3$ class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: $Al_{(1-x)}Sc_{(x)}N$, $Ga_{(1-x)}Sc_{(x)}N$, $Al_{(1-x)}Y(x)N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO) or BFO with doping material.

In some embodiments, the FE material includes Bismuth ferrite or BFO with a doping material wherein the doping material is one of lanthanum, or any element from the lanthanide series of the periodic table. In some embodiments, the FE material includes a relaxor ferroelectric including one of barium titanium-bismuth zinc niobium tantalum (BT-BZNT), or barium titanium-barium strontium titanium (BT-BST).

In some embodiments, the FE material includes Hafnium oxides of the form, $Hf_{(1-x)}E_xO_y$ where E can be Al, Ca, Ce, Dy, Er, Gd, Ge, La, Sc, Si, Sr, Sn, or Y. In some embodiments, FE material includes niobate type compounds $LiNbO_3$, $LiTaO_3$, lithium iron tantalum oxy fluoride, barium strontium niobate, sodium barium niobate, or potassium strontium niobate.

In some embodiments, the FE material comprises multiple layers. For example, alternating layers of $[Bi_2O_2]2+$, and pseudo-perovskite blocks ($Bi_4Ti_3O_{12}$ and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as $SrRuO_3$) is coated on top of $IrO_2$, $RuO_2$, $PdO_2$, $PtO_2$ (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: $PtCoO_2$, $PdCoO_2$, and other delafossite structured hexagonal metallic oxides such as Al-doped ZnO. Examples of spinels include $Fe_3O_4$ and $LiV_2O_4$. Examples of cubic metals include indium tin oxide (ITO) such as Sn-doped $In_2O_3$.

The charge developed on node Vs produces a voltage and current that is the output of the majority gate 1400. Any suitable driver circuitry 1401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

The majority function is performed at the summing node Vs, and the resulting voltage is projected on to capacitance of driver circuitry 1401. For example, the majority function of the currents ($I_a$, $I_b$, and $I_c$) on node Vs results in a resultant current that charges capacitor 105. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 1400. Any suitable driver circuitry 1401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 14 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 1400 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 1401 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\Delta$), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 15:
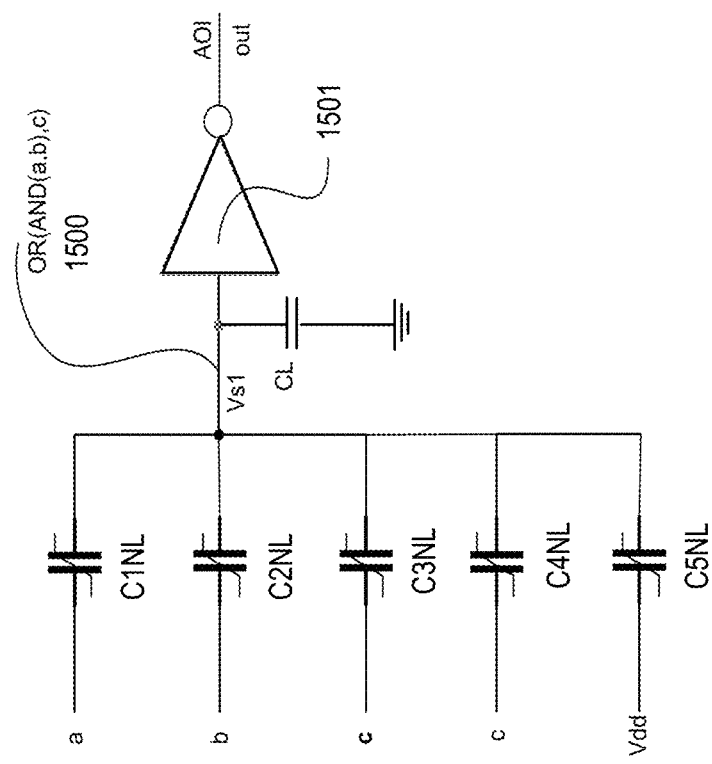
FIG. 15 illustrates a complex logic gate implemented using a 5-input majority gate, in accordance with some embodiments.

FIG. 15 illustrates complex logic gate 1500 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 1501 coupled as shown. In various embodiments, two of the non-linear capacitors receives the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

Following examples are provided that illustrate the various embodiments. The examples can be combined with other examples. As such, various embodiments can be combined with other embodiments without changing the scope of the invention.

Example 1: A device comprising: a first region comprising: a plurality of first conductive interconnects within a first level; a second level above the first level, the second level comprising: a plurality of ferroelectric memory devices above a respective first conductive interconnect in the plurality of first conductive interconnects; an electrode structure coupled between a respective ferroelectric memory device in the plurality of ferroelectric memory devices and the respective first conductive interconnect, the electrode structure comprising a first sidewall; and an encapsulation layer on a second sidewall of individual ones of the plurality of ferroelectric memory devices, wherein an outer third sidewall of the encapsulation layer is substantially aligned with the first sidewall; a via electrode on individual ones of the plurality of ferroelectric memory devices; and a second region adjacent to the first region, the second region comprising: an interconnect structure comprising; one or more second conductive interconnects within the first level; an etch stop layer comprising a dielectric material in the second level; a plurality of metal lines above the etch stop layer, the plurality of metal lines in the second level; and a via structure coupling a respective metal line in the plurality of metal lines and a second conductive interconnect in the one or more second conductive interconnects, and wherein an uppermost surface of the via electrode is co-planar with an uppermost surface of the plurality of metal lines.

Example 2: The device of example 1, wherein the electrode structure comprises a first lateral thickness and individual ones of the plurality of first conductive interconnects comprises a second lateral thickness, wherein the first lateral thickness is greater than the second lateral thickness.

Example 3: The device of example 1, wherein the electrode structure comprises a first vertical thickness, the respective ferroelectric memory device comprises a second vertical thickness and the via electrode comprises a third electrode thickness, wherein the via structure comprises a fourth vertical thickness, and individual ones of the plurality of metal lines comprises a fifth vertical thickness, wherein a combined sum of the first, the second and the third vertical thicknesses is substantially equal to a combined sum of the fourth and the fifth vertical thicknesses.

Example 4: The device of example 3, wherein the etch stop layer comprises a sixth vertical thickness, and wherein the first vertical thickness is less than 25% of the sixth vertical thickness.

Example 5: The device of example 3, wherein the etch stop layer comprises a sixth vertical thickness, and wherein the first vertical thickness is between 25% and 50% of the sixth vertical thickness.

Example 6: The device of example 1, wherein the encapsulation layer laterally extends on a portion of an uppermost surface of the electrode structure Example 7: The device of example 6, wherein the encapsulation layer laterally extends on a portion of an uppermost surface of the electrode structure by a distance that is at least 25% of a thickness of the encapsulation layer, wherein the thickness of the encapsulation layer is measured from the second sidewall.

Example 8: The device of example 6, wherein the encapsulation layer laterally extends on a portion of an uppermost surface of the electrode structure by a distance that is equal to a thickness of the encapsulation layer as measured from the second sidewall.

Example 9: The device of example 1, wherein the plurality of ferroelectric memory devices is a first plurality of ferroelectric memory devices, wherein the electrode structure is a first electrode structure, wherein the encapsulation layer is a first encapsulation layer, wherein the device further comprises: a plurality of third conductive interconnects on a plane behind a plane comprising the plurality of first conductive interconnects; a second plurality of ferroelectric memory devices above a respective third conductive interconnect in the third plurality of conductive interconnects; and a second electrode structure coupled between a respective ferroelectric memory device in the second plurality of ferroelectric memory devices and the respective conductive interconnect in the third plurality of conductive interconnects, the second electrode structure comprising a fourth sidewall; and a second encapsulation layer on a fifth sidewall of individual ones of the plurality of ferroelectric memory devices, wherein an outer sixth sidewall of the encapsulation layer is substantially aligned with the fourth sidewall.

Example 10: The device of example 8, wherein the first electrode structure is directly below a first ferroelectric memory device in the first plurality of ferroelectric memory devices and laterally extends towards the second electrode structure that is directly below the second ferroelectric memory device in the second plurality of ferroelectric memory devices, where the second ferroelectric memory device is directly behind the first ferroelectric memory device.

Example 11: The device of example 10, wherein the first electrode structure and the second electrode structure have a respective lateral thickness that varies along a direction from the first ferroelectric memory device to the second ferroelectric memory device.

Example 12: The device of example 10, wherein the first electrode structure and the second electrode structure have a respective lateral thickness that is constant along a direction from the first ferroelectric memory device to the second ferroelectric memory device.

Example 13: A device comprising: a first region comprising: a trench interconnect extending along a first direction within a first level; a second level above the first level, the second level comprising: a plurality of ferroelectric memory devices laterally spaced apart above the trench interconnect; an electrode structure comprising a first sidewall, the electrode structure coupled between a respective ferroelectric memory device in the plurality of ferroelectric memory devices and the trench interconnect; and an encapsulation layer on second sidewalls of individual ones of the plurality of ferroelectric memory devices, wherein an outer third sidewall of the encapsulation layer is substantially aligned with the first sidewall; a via electrode on individual ones of the plurality of ferroelectric memory devices; and a second region adjacent to the first region, the second region comprising: an interconnect structure comprising; one or more conductive interconnects within the first level; an etch stop layer comprising a dielectric material in the second level; a plurality of metal lines above the etch stop layer, the plurality of metal lines in the second level; and a via structure coupling a respective metal line in the plurality of metal lines and a conductive interconnect in the one or more conductive interconnects, and wherein an uppermost surface of the via electrode is co-planar with an uppermost surface of the plurality of metal lines.

Example 14: The device of example 13, wherein the electrode structure has a first lateral thickness and trench interconnect comprises a second lateral thickness, wherein the first lateral thickness is greater than the second lateral thickness.

Example 15: The device of example 13, wherein the electrode structure extends continuously from under a first ferroelectric memory device in the plurality of ferroelectric memory devices to a second ferroelectric memory device in the plurality of ferroelectric memory devices.

Example 16: The device of example 15, wherein the encapsulation layer extends continuously from adjacent to the first ferroelectric memory device to the second ferroelectric memory device.

Example 17: The device of example 13, wherein the electrode structure comprises a first vertical thickness, individual ones of the plurality of ferroelectric memory devices comprise a second vertical thickness and the via electrode comprises a third electrode thickness, wherein the via structure comprises a fourth vertical thickness, and individual ones of the plurality of metal lines comprise a fifth vertical thickness, wherein a combined sum of the first, the second and the third vertical thicknesses is substantially equal to a combined sum of the fourth and the fifth vertical thicknesses.

Example 18: The device of example 13, wherein the etch stop layer has a sixth vertical thickness, and wherein the first vertical thickness is less than 25% of the sixth vertical thickness.

Example 19: A method of fabricating a device structure, the method comprising: forming a plurality of conductive interconnects in a dielectric in a memory region and one or more conductive interconnects in a logic region; depositing an etch stop layer on the dielectric and on the plurality of conductive interconnects and on the one or more conductive interconnects; etching to remove the etch stop layer from a memory region but not from a logic region; depositing an electrode material on the plurality of conductive interconnects in the memory region and on the etch stop layer in the logic region; depositing a material layer stack on the electrode material; forming a plurality of memory devices by etching the material layer stack, wherein the etching forms a memory device of the plurality of memory devices above a respective conductive interconnect in the plurality of conductive interconnects in the memory region; depositing an encapsulation layer on the plurality of memory devices and on the electrode material; forming a mask on the encapsulating layer and patterning the encapsulating layer and electrode material, wherein the mask is above an individual memory device in the plurality of memory devices; blanket depositing a dielectric layer; forming a plurality of openings in the dielectric layer, the plurality of openings exposing a respective memory device in the plurality of memory devices; forming a respective via electrode in a respective opening in the plurality of openings by depositing a conductive material in the plurality of openings; forming one or more openings in the dielectric layer and in the encapsulation layer, the one or more openings exposing the one or more conductive interconnects in the logic region; and forming an interconnect via in a respective one or more openings and a metal line on a respective interconnect via by depositing the conductive material in the one or more openings.

Example 20: The method of example 19, wherein forming the mask on the encapsulation layer comprises covering a plurality of devices, and wherein etching the encapsulation layer and the electrode material comprises etching to forming an electrode structure that couples a lowermost electrode of a first memory device with a lowermost electrode of a second memory device.

Example 21: A device comprising: a first region comprising: a first conductive interconnect within a first level; a second level above the first level, the second level comprising: a ferroelectric memory device comprising a first height and further comprising a cylindrical shape, the ferroelectric memory device above the first conductive interconnect; an electrode structure coupled between the ferroelectric memory device and the first conductive interconnect, the electrode structure comprising a first sidewall; and an encapsulation layer on a second sidewall of the ferroelectric memory device, wherein an outer third sidewall of the encapsulation layer is substantially aligned with the first sidewall; and a via electrode on the ferroelectric memory device; and a second region adjacent to the first region, the second region comprising an interconnect structure, the interconnect structure comprising: a second conductive interconnects within the first level; an etch stop layer comprising a dielectric material in the second level; a metal line above the etch stop layer, wherein the metal line is in the second level; and a via structure coupling the metal line with the second conductive interconnect in the wherein the via structure is in the second level and wherein an uppermost surface of the via electrode is co-planar with an uppermost surface of metal line.

Example 22: The device of claim 21, wherein the electrode structure comprises a cylindrical shape and a first lateral thickness and the first conductive interconnect comprises a cylindrical shape and a second lateral thickness, wherein the first lateral thickness is a first diameter and the second lateral thickness is a second diameter, wherein the first lateral thickness is greater than the second lateral thickness.

Example 23: The device of claim 21, wherein the electrode structure comprises a cylindrical shape and a first lateral thickness and the first conductive interconnect comprises a cylindrical shape and a second lateral thickness, wherein the first lateral thickness is a first diameter and the second lateral thickness is a second diameter, wherein the first lateral thickness is less than the second lateral thickness.

Example 24: The device of claim 21, wherein the electrode structure comprises a first vertical thickness under the ferroelectric memory device and a second vertical thickness under the encapsulation layer.

Example 25: The device of claim 22, wherein the first conductive interconnect comprises one or more of copper, cobalt, tungsten, ruthenium, molybdenum, tantalum or titanium.

Example 26: The device of claim 22, wherein the first conductive interconnect comprises one or more of cobalt, tungsten, ruthenium, molybdenum, tantalum or titanium, but not copper.

Example 27: The device of claim 21, wherein the electrode structure comprises an uppermost surface under the ferroelectric memory device, and an adjoining surface not under the ferroelectric memory device, wherein the adjoining surface is sloped and the encapsulation layer laterally extends on a portion of the adjoining surface.

Example 28: The device of claim 21, wherein the ferroelectric memory devices is a first ferroelectric memory device, wherein the electrode structure is a first electrode structure, wherein the encapsulation layer is a first encapsulation layer, wherein the via electrode is a first via electrode and wherein the device further comprises: a third conductive interconnect on a plane behind a plane comprising the first conductive interconnect; a second ferroelectric memory device above the third conductive interconnect; a second electrode structure coupled between the second ferroelectric memory device and the third conductive interconnect, the second electrode structure comprising a fourth sidewall; a second encapsulation layer on a fifth sidewall of the second ferroelectric memory device, wherein an outer sixth sidewall of the encapsulation layer is substantially aligned with the fourth sidewall; and a second via electrode on the second ferroelectric memory device.

Example 29: The device of claim 28, wherein the first electrode structure and the second electrode structure comprise the same material, the first encapsulation layer and the second encapsulation layer comprise the same material, and wherein the first electrode structure and extends along a shortest distance to the second the second electrode structure, and wherein the first encapsulation layer extends along a shortest distance from above the first electrode structure to the second electrode structure.

Example 30: The device of claim 29, wherein the first conductive interconnect extends from under the first ferroelectric memory device to under the second ferroelectric memory device.

Example 31: The device of claim 28, wherein the first via electrode and the second via electrode are coupled by a plate electrode extending from above the first ferroelectric memory device to a second ferroelectric memory device, wherein the plate electrode is within the second level.

Example 32: The device of claim 21, wherein the first ferroelectric memory device comprises sidewalls that are substantially vertical respect to a lowermost surface of the first ferroelectric memory device.

Example 33: The device of claim 21, wherein the first ferroelectric memory device comprises sidewalls that have a slope that is different from 90° with respect to a lowermost surface of the first ferroelectric memory device.

Example 34: The device of claim 21, wherein the device further comprises: a portion of the electrode structure adjacent to a sidewall of the etch stop layer at a boundary between the memory region and the logic region; and a portion of one or more layers of the ferroelectric memory device adjacent to the portion of the electrode structure adjacent to the sidewall.

Example 35: The device of claim 34, wherein the portion of the electrode structure further extends onto an uppermost surface of the etch stop layer.

Example 36: The device of claim 21, wherein the electrode structure comprises a first vertical thickness, the ferroelectric memory device comprises a second vertical thickness, the via electrode comprises a third vertical thickness, the via structure comprises a fourth vertical thickness and the metal line comprises a fifth vertical thickness, wherein a sum of the first, second and third vertical thicknesses is substantially equal to a combined sum of the fourth and fifth vertical thicknesses.

Example 37: The device of claim 36, wherein a sum of the first and the second vertical thicknesses is substantially equal to the fourth vertical thickness, and the third vertical thickness is substantially equal to the fifth vertical thickness.

Example 38: The device of claim 36, wherein the first vertical thickness is less than 10 nm, second vertical thickness is less than 20 nm, the third vertical thickness is greater than 50 nm but less than 200 nm.

Example 39: A method of fabricating a device structure, the method comprising: forming a plurality of conductive interconnects in a dielectric in a memory region and one or more conductive interconnects in a logic region; depositing an etch stop layer on the dielectric and on the plurality of conductive interconnects and on the one or more conductive interconnects; etching to remove the etch stop layer from a memory region but not from a logic region; depositing an electrode material on the plurality of conductive interconnects in the memory region and on the etch stop layer in the logic region; depositing a material layer stack on the electrode material; forming a plurality of memory devices by etching the material layer stack, wherein the etching forms a memory device of the plurality of memory devices above a respective conductive interconnect in the plurality of conductive interconnects in the memory region; depositing an encapsulation layer on the plurality of memory devices and on the electrode material; forming a mask on the encapsulating layer and patterning the encapsulating layer and electrode material, wherein the mask is above an individual memory device in the plurality of memory devices; blanket depositing a dielectric layer; forming one or more first openings in the dielectric layer and in the encapsulation layer, the first one or more openings exposing the one or more conductive interconnects in the logic region and simultaneously forming a second one or more openings in the memory region, the second one or more openings exposing plurality of memory devices; forming an interconnect via in a respective first one or more openings and a metal line on a respective interconnect via, and forming a via electrode in the second one or more openings by depositing a conductive material in the first and in the second one or more openings.

Example 40: The method of claim 39, wherein the method of forming the interconnect via in a respective first one or more openings further comprises: masking the second one or more openings and a portion of the first one or more openings; forming a second opening within the portion of the first one or more openings; etching the dielectric exposed by the second opening; etching the etch stop layer after etching the dielectric, the etching exposing a conductive interconnect in the one or more conductive interconnects in the logic region.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A method of fabricating a device structure, the method comprising:
    forming a first conductive interconnect in a dielectric in a memory region and a second conductive interconnect in a logic region;
    depositing an etch stop layer on the dielectric and on the first conductive interconnect and on the second conductive interconnect;
    etching and removing the etch stop layer from the memory region but not from the logic region;
    depositing an electrode material on the first conductive interconnect and on the etch stop layer, wherein depositing the electrode material includes depositing the electrode material on a sidewall of the etch stop layer at an interface between the memory region and the logic region;
    depositing a material layer stack including ferroelectric material or paraelectric material on the electrode material;
    forming a memory device by etching the material layer stack, wherein the etching forms the memory device directly above the first conductive interconnect and a spacer of the material layer stack adjacent to the electrode material on the sidewall of the etch stop layer;
    depositing an encapsulation layer on the memory device on the electrode material, and on the spacer of the material layer stack;
    forming a mask on the encapsulation layer, wherein forming the mask further comprises forming the mask above the memory device and forming on the encapsulation layer deposited on the spacer of the material layer stack;
    etching the encapsulation layer and exposing the electrode material;
    etching the electrode material, wherein etching the electrode material comprises:
        forming an electrode structure under the memory device;
        leaving a first portion of the electrode material adjacent to the sidewall of the etch stop layer; and
        leaving a second portion of the encapsulation layer on the spacer of the material layer stack and on surfaces of the electrode material;
    blanket depositing a dielectric layer;
    forming a first opening in the dielectric layer, the first opening exposing the second conductive interconnect in the logic region;
    forming an interconnect via in the first opening and a metal line on the interconnect via by depositing a conductive material in the first opening;
    forming a second opening in the dielectric layer and in the encapsulation layer in the memory region, the second opening exposing the memory device; and
    forming a via electrode in the second opening by depositing the conductive material in the second opening.

2. The method of claim 1, wherein the ferroelectric material comprises:
    one of bismuth ferrite (BFO), BFO with a first doping material wherein the first doping material is one of lanthanum or elements from lanthanide series of periodic table;
    lead zirconium titanate (PZT), or PZT with a second doping material, wherein the second doping material is one of La or Nb;
    a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
    a perovskite material which includes one of: $BaTiO_3$, $PbTiO_3$, $KNbO_3$, or $NaTaO_3$; hexagonal ferroelectric which includes one of: $YMnO_3$, or $LuFeO_3$;
    hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    hafnium (Hf), zirconium (Zr), aluminum (Al), silicon (Si), their oxides, or their alloyed oxides;
    hafnium oxides as $Hf_{(1-x)}E_xO_y$, where E includes one of: Al, Ca, Ce, Dy, Er, Gd, Ge, La, Sc, Si, Sr, Sn, Zr, or Y;
    $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are first and second fractions, respectively;
    $HfO_2$ doped with one of: Al, Ca, Ce, Dy, Er, Gd, Ge, La, Sc, Si, Sr, Sn, or Y;
    niobate type compounds $LiNbO_3$, $LiTaO_3$, lithium iron tantalum oxy fluoride, barium strontium niobate, sodium barium niobate, or potassium strontium niobate; or
    an improper ferroelectric material which includes one of: [PTO/STO]n or [LAO/STO]n, where 'n' is between 1 and 100;

wherein the paraelectric material comprises: SrTiO$_3$, Ba$_{(x)}$Sr$_{(y)}$TiO$_3$ (where x is −0.05, and y is 0.95), Hf—Si—O, La-substituted PbTiO$_3$, or a PMN-PT based relaxor ferroelectrics.

3. The method of claim 1, wherein etching the material layer stack to form the memory device further comprises etching a third portion of the electrode material and recessing the electrode material adjacent to the memory device relative to an uppermost surface of the electrode material in the memory region.

4. The method of claim 1, wherein the mask above the memory device comprises a first lateral thickness that is at least equal to a second lateral thickness of the memory device and two times a third lateral thickness of the encapsulation layer.

5. The method of claim 4, wherein etching the encapsulation layer further comprises:
forming a patterned encapsulation layer comprising:
a fourth portion on the memory device;
a fifth portion adjacent to sidewalls of the memory device, the fifth portion comprising a fourth lateral thickness; and
a lateral extension adjacent to the fifth portion, the lateral extension on a sixth portion of the electrode material,
wherein the electrode structure comprises:
a fifth lateral thickness that is greater than the second lateral thickness; and
a first sidewall that is aligned with an outermost sidewall of the lateral extension.

6. The method of claim 5, wherein etching the electrode material further comprises etching a seventh portion of the dielectric adjacent to the first conductive interconnect, but not exposing the first conductive interconnect under the electrode structure.

7. The method of claim 4, wherein the first lateral thickness is equal to the second lateral thickness and two times the third lateral thickness, wherein etching the encapsulation layer on the electrode material forms a patterned encapsulation layer having a uniform lateral thickness and an outermost encapsulation layer sidewall, wherein etching the electrode material comprises using a plasma etch process, and wherein the electrode structure comprises a third sidewall that is aligned with the outermost encapsulation layer sidewall.

8. The method of claim 1, wherein etching the electrode material further comprises forming a structure having a eight portion on the dielectric, a ninth portion on the sidewall of the encapsulation layer and a tenth portion on an uppermost surface of the encapsulation layer.

9. The method of claim 1, wherein the method of forming the first opening further comprises:
forming a hanging trench above the second conductive interconnect;
forming a via mask within the hanging trench, the via mask comprising a third opening; and
forming a fourth opening by etching the dielectric layer exposed by the third opening and by etching the etch stop layer after etching the dielectric, the etching exposing the second conductive interconnect.

10. The method of claim 9, wherein forming the metal line and the interconnect via comprises:
simultaneously depositing the conductive material in the hanging trench and in the fourth opening and on the dielectric layer; and
planarizing the conductive material from above the dielectric layer.

11. A method of fabricating a device structure, the method comprising:
forming a first conductive interconnect in a dielectric in a memory region and a second conductive interconnect in a logic region;
depositing an etch stop layer on the dielectric and on the first conductive interconnect and on the second conductive interconnect;
etching and removing the etch stop layer from the memory region but not from the logic region;
depositing an electrode material on the first conductive interconnect and on the etch stop layer, wherein depositing the electrode material includes depositing on a sidewall of the etch stop layer at an interface between the memory region and the logic region;
depositing a material layer stack including ferroelectric or paraelectric material on the electrode material;
forming a memory device by etching the material layer stack, wherein the etching forms the memory device directly above the first conductive interconnect, and wherein etching the material layer stack forms a spacer of the material layer stack adjacent to the electrode material on the sidewall of the etch stop layer;
depositing an encapsulation layer on the memory device and on the electrode material, and on the spacer of the material layer stack;
forming a first mask on the encapsulation layer, wherein forming the first mask further comprises forming the first mask above the memory device and forming the first mask on the encapsulation layer deposited on the spacer of the material layer stack;
etching the encapsulation layer and exposing the electrode material;
etching the electrode material, wherein etching the electrode material comprises:
forming an electrode structure under the memory device;
leaving a first portion of the electrode material adjacent to the sidewall of the etch stop layer; and
leaving a second portion of the encapsulation layer on the spacer of the material layer stack and on surfaces of the electrode material;
blanket depositing a dielectric layer;
forming a hanging trench in the dielectric layer over the second conductive interconnect by etching the dielectric layer in the logic region and simultaneously forming a first opening to expose the memory device, wherein the first opening is formed by etching the dielectric layer and the encapsulation layer above the memory device;
forming a second mask within the hanging trench and in the first opening, the second mask comprising a second opening within the hanging trench;
forming a third opening by etching the dielectric exposed by the second opening and by etching the etch stop layer after etching the dielectric, the etching exposing the second conductive interconnect;
removing the second mask and simultaneously depositing a conductive material in the first opening, in the third opening and in the hanging trench and on the dielectric; and
planarizing the conductive material to simultaneously form a via electrode on the memory device, and via interconnect in the third opening and a metal line in the hanging trench.

12. The method of claim 11, wherein etching the dielectric layer and the encapsulation layer to form the first opening recesses the hanging trench below a level of an uppermost surface of the memory device.

13. The method of claim 12, wherein the hanging trench is recessed below the uppermost surface of the memory device by up to 5% of a total depth of the first opening.

14. A method of fabricating a device structure, the method comprising:
    forming a first trench interconnect in a dielectric in a memory region and a second trench interconnect in a logic region;
    depositing an etch stop layer on the dielectric and on the first trench interconnect and on the second trench interconnect;
    etching to remove the etch stop layer from the memory region but not from the logic region;
    depositing an electrode material on the first trench interconnect, on the etch stop layer, and on a sidewall of the etch stop layer at an interface between the memory region and the logic region;
    depositing a material layer stack on the electrode material;
    forming a memory device by etching the material layer stack, wherein the etching forms the memory device directly above the first trench interconnect and a spacer of the material layer stack adjacent to the electrode material on the sidewall of the etch stop layer;
    depositing an encapsulation layer on the memory device, on the electrode material, and on the spacer of the material layer stack;
    forming a mask on the encapsulation layer and the electrode material, wherein the mask covers the memory device and a first portion of the encapsulation layer;
    forming a mask on the encapsulation layer, wherein forming the mask further comprises forming the mask above the memory device and forming the mask on the encapsulation layer deposited on the spacer of the material layer stack;
    etching the encapsulation layer and exposing the electrode material;
    etching the electrode material, wherein etching the electrode material comprises:
        forming an electrode structure under the memory device;
        leaving a second portion of the electrode material adjacent to the sidewall of the etch stop layer; and
        leaving a third portion of the encapsulation layer on the spacer of the material layer stack and on surfaces of the electrode material;
    blanket depositing a dielectric layer;
    forming a first opening in the dielectric layer and in the encapsulation layer above the memory device and simultaneously forming a second opening in the dielectric layer above the second trench interconnect;
    completely masking the first opening and partially masking the second opening to form a via opening within the second opening;
    etching the dielectric layer through the via opening and exposing the second trench interconnect; and
    forming a via electrode in the first opening, a via structure in the via opening and a metal line in the second opening by depositing a conductive material in the first opening, in the via opening and in the second opening.

15. The method of claim 14, wherein the mask covers a fourth portion of the encapsulation layer that is above the dielectric adjacent to the first trench interconnect.

16. The method of claim 14, wherein the memory device is a first memory device, wherein the first memory device is above a fifth portion of the first trench interconnect, and wherein etching the material layer stack forms a second memory device above a sixth portion of the first trench interconnect, the sixth portion laterally distant from the first portion.

17. The method of claim 16, wherein the mask covers the first memory device, the second memory device and the first trench interconnect between the first memory device and the second memory device.

* * * * *